(12) United States Patent
Morrison

(10) Patent No.: US 10,049,500 B2
(45) Date of Patent: Aug. 14, 2018

(54) AUGMENTED REALITY E-COMMERCE FOR HOME IMPROVEMENT

(71) Applicant: 3D Product Imaging Inc., Seattle, WA (US)

(72) Inventor: Darrick Morrison, Seattle, WA (US)

(73) Assignee: 3D Product Imaging Inc., Seattle, WA (US)

( * ) Notice: Subject to any disclaimer, the term of this patent is extended or adjusted under 35 U.S.C. 154(b) by 23 days.

(21) Appl. No.: 15/273,425

(22) Filed: Sep. 22, 2016

(65) Prior Publication Data

US 2017/0132841 A1 May 11, 2017

Related U.S. Application Data

(60) Provisional application No. 62/222,140, filed on Sep. 22, 2015.

(51) Int. Cl.
| | |
|---|---|
| *G06T 19/00* | (2011.01) |
| *G06F 17/50* | (2006.01) |
| *G06Q 30/06* | (2012.01) |
| *G06F 3/0481* | (2013.01) |
| *G06K 9/00* | (2006.01) |
| *G06T 19/20* | (2011.01) |

(52) U.S. Cl.
CPC ........ *G06T 19/006* (2013.01); *G06F 3/04815* (2013.01); *G06F 17/5004* (2013.01); *G06K 9/00671* (2013.01); *G06Q 30/0643* (2013.01); *G06T 19/20* (2013.01); *G06T 2200/24* (2013.01); *G06T 2219/004* (2013.01); *G06T 2219/2012* (2013.01)

(58) Field of Classification Search
CPC ........ G06T 19/006; G05B 2219/32014; G06K 9/00671; G06F 17/5004
See application file for complete search history.

(56) References Cited

U.S. PATENT DOCUMENTS

| | | | |
|---|---|---|---|
| 2006/0111878 A1* | 5/2006 | Pendyala | G06F 17/5004 703/1 |
| 2012/0243739 A1* | 9/2012 | Fukuchi | G06K 9/00671 382/103 |
| 2013/0106910 A1* | 5/2013 | Sacco | G06T 19/006 345/633 |

(Continued)

*Primary Examiner* — Daniel Hajnik
(74) *Attorney, Agent, or Firm* — Han Santos, PLLC

(57) ABSTRACT

Augmented reality e-commerce may be useful for home improvement store chains that offer products and services. Initially, environmental data that includes spatial data or image data may be received from scanning sensors. The environmental data may be analyzed to detect recognizable patterns that represent environmental features. The environmental features may include surfaces or objects. Subsequently, a user selection of a surface or an object as a feature that is related to a desired product may be received. The feature is then compared to existing data to determine a specific product that fits the environment, in which the existing data includes at least one of virtual image data or product data. Further, an augmented reality environment that corresponds to the environment may be generated for presentation via an augmented reality device, in which the augmented reality environment may present a three-dimensional (3D) virtual representation of the specific product.

20 Claims, 12 Drawing Sheets

(56) References Cited

U.S. PATENT DOCUMENTS

| | | | |
|---|---|---|---|
| 2013/0120368 A1* | 5/2013 | Miller | G06T 15/00 345/419 |
| 2013/0212513 A1* | 8/2013 | Loberg | G06F 17/5004 715/771 |
| 2014/0380221 A1* | 12/2014 | Cho | G06F 17/5004 715/771 |
| 2015/0106740 A1* | 4/2015 | Tan | G06F 3/0484 715/750 |
| 2015/0116356 A1* | 4/2015 | Alon | G01C 21/206 345/633 |
| 2016/0104452 A1* | 4/2016 | Guan | G06T 19/006 345/633 |
| 2017/0323488 A1* | 11/2017 | Mott | G06T 19/006 |

\* cited by examiner

AUGMENTED REALITY E-COMMERCE FOR HOME IMPROVEMENT

CROSS REFERENCE TO RELATED PATENT APPLICATION

This application claims priority to U.S. Provisional Patent Application No. 62/222,140, filed on Sep. 22, 2015, entitled "Augmented Reality E-Commerce for Home Improvement," which is hereby incorporated by reference in its entirety.

BACKGROUND

There are many techniques to generate illusions, or specifically to present artificial experiences over an observer's experiences. Illusion techniques may relate to how to position imagery within an environment. For example, the Pepper's Ghost illusion uses half mirrors or semi-reflective glass panes to present images next to physical objects. Illusion techniques may also relate to how to animate imagery. With the advent of computerized graphics, there are an increasing number of illusion techniques related to computer animations. For example, the Pinball 2000™ platform from WMS Industries, Inc., uses Pepper's Ghost techniques to display computer generated objects not only next to pinball bumpers and obstacles, but also to interact with the pinball in motion.

Accordingly, objects may be fully computer generated. Such objects are called virtual objects. In general, virtual items are computer generated items. For example, a computer generated environment is called a virtual environment. In contrast, real world items are called physical items. Moreover, the real world comprises a physical environment and physical objects. While physical items may be called real items in some contexts, the term "physical" is used in this patent application to prevent confusion in referring to objects in augmented or virtual "reality" environments and objects in the "real world."

The technique of overlaying animated virtual objects over physical objects and a physical environment is called augmented reality. Specifically, an observer's experience in the physical world is augmented with computer animations presented in observer's context. Thus, the addition of virtual objects not only add to the observer's experience, the virtual objects are also relevant to the observer's activities at that time.

Augmented reality is distinct from virtual reality. Augmented reality overlays virtual objects over the physical world. In contrast, virtual reality is comprised solely virtual objects and generally is a completely virtual experience. For example, Google Glasses™ allow an observer to perceive the physical world through glasses, but overlay virtual objects over the glasses to augment the wearer's experience. However, Oculus Rift™ displays solely virtual objects. A virtual reality headset worn by a user may project into the user's field of vision images that may cause the user to perceive that he or she is immersed in a virtual world.

One common experience is that of commerce. With the rise of the internet, e-commerce, the searching, inspecting and purchasing of objects via a computer, usually over the internet, has become a daily experience. With the ubiquity of computing resources and multimedia capture devices, e-commerce experiences have been the subject of augmented reality. For example, Lego™ stores have computer screens such that when a customer holds an unboxed Lego kit, the screen shows the customer holding the box with an animated virtual constructed kit on the box. As the customer moves the box, the virtual objects move as well, thereby providing the customer with a degree of manipulation control over the virtual objects.

Further, companies have found that the chance of a customer making a purchase is greatly improved when guided by a company representative who can adapt to the specific needs of the customer. For example, intervention by a car salesman may increase the chance a customer may purchase a car at a car lot. Additionally, sales representatives for companies selling home appliances often visit the homes of prospective customers. This method has been known to facilitate sales by addressing constraints specific to a given customer's home, e.g., special measurements and interior design considerations.

BRIEF DESCRIPTION OF THE DRAWINGS

The Detailed Description is set forth with reference to the accompanying figures.

DETAILED DESCRIPTION

Definitions

Preliminary to proceeding with the detailed description, the following term definitions are provided:

360° Spin Representation—Model data for a virtual object so that it may be viewed from any angle, where an observer may move around the object, and where the mounting is not visible. A consequence of 360° spin representation is that it is more difficult to create content since mounts are harder to hide, and non-rigid objects have to be made rigid.

Augmented Reality—The overlaying of virtual objects and/or other virtual experiences over the physical environment and/or physical objects in the context of an observer's activities.

Brand Data—Product promotional data from the manufacturer of a product, which may include: logos, endorsements, and coupons.

Environment—The area surrounding an observer providing context and a locale for the observer to interact with the objects.

Immersion—Completely surrounded with a virtual environment and virtual objects. For example the Oculus Rift™ provides an immersive virtual experience.

Model—A graphical three-dimensional (3D) virtual object to be rendered.

Model Data—The data used to render a Model. Model data may comprise: objects, meshes, textures, and shaders.

Next Best Thing (NBT)—A virtual object model data representation with fidelity less than 360° spin representation. NBT is a resolution fallback if a computer client lacks support 360° spin representation.

Overlay—The adding of virtual objects to a physical environment. For example, Google Glasses™ overlays virtual objects over the physical environment as perceived through the glasses.

Photorealism/Photorealistic—The quality of being visually indistinguishable from physical objects.

Product Data—Data specific to a product to be sold, which may include: product name, Stock Keeping Unit (SKU), price, Universal Product Code (UPC) number, and branding data.

User Generated Content—Product data created by customers and may include: multimedia reviews, ratings, and unboxing videos.

Virtual Reality—A computer generated experience comprising a virtual environment and virtual objects.

WebGL—A standard Application Programming Interface (API) to render graphics, in which a viewer or rendering platform does not support WebGL, or in which platform support is lacking. Typically, a platform will support fallback to other alternative graphical APIs if WebGL is not supported.

Overview of Augmented Reality E-Commerce

Figure 1:
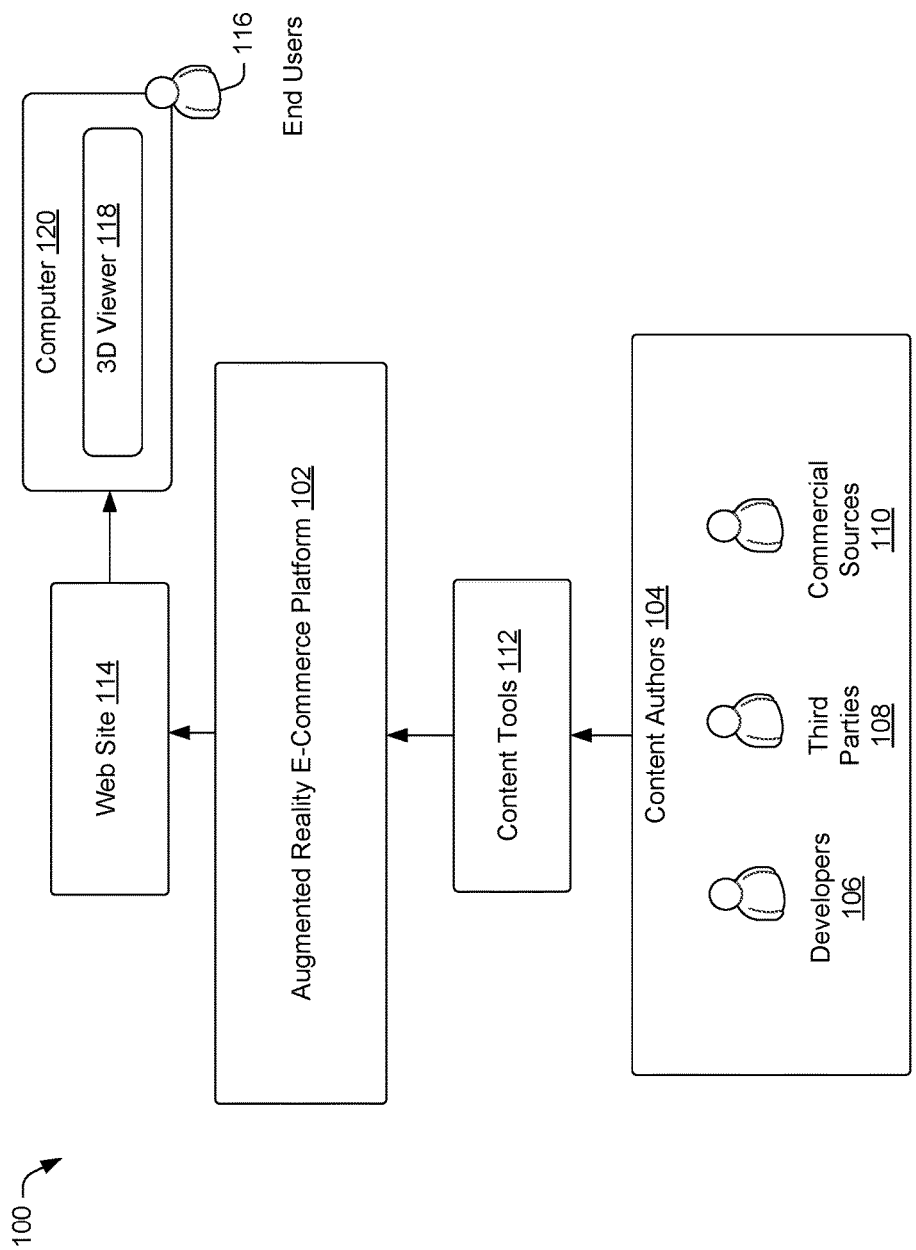
FIG. 1 is a top level diagram illustrative of augmented reality e-commerce.

An augmented reality e-commerce platform may be conceived as a content management system. Content is authored and maintained. Content is served upon request subject to various constraints, typically to an intermediary such as a web site. Content is rendered to an end user. Service of content is generally metered, billed, and audited. These processes are illustrated with respect to FIG. 1, a context diagram for augmented reality e-commerce 100.

The augmented reality e-commerce platform, or platform for short, 102 receives content from content authors 104. Content authors 104 may be developers for the platform 106, third parties 108, or commercial sources such as retailers and manufacturers 110. Content authors 104 may use standard tools 112 to develop content prior to upload to the platform 102. The content authoring process is described in greater detail with respect to FIG. 5.

The augmented reality e-commerce platform 102 (platform) serves content based on requests from a consumer facing web site 114. The augmented reality e-commerce platform 102 may take on many manifestations, one of which is a content management system by itself, others are the content management system combined with other infrastructure. The content management system and its surrounding infrastructure are discussed in further detail with respect to FIG. 2. The web site 114 is generally making requests in response to prompts from an end user 116, where the end user is operating an augmented reality viewer 118 that is coupled to a computer 120. In turn, the augmented virtual reality viewer 118 is used by the end user to access the web site 114. The service of content process is described in greater detail with respect to FIG. 4.

As mentioned above, the web site 114 makes requests of the augmented reality e-commerce platform 102 based on prompts from an end user 116. The web site 114 generally does not merely forward requests from end user 116. Rather, the web site 114 constructs an augmented reality experience by using the content served from the platform 102 as virtual objects to overlay over the physical environment and objects of the end user 116. The logic as to what virtual objects to overlay, and how, generally resides in the web site 114. The process to generate and present an augmented reality end user experience is described in greater detail with respect to FIG. 6.

The various entities interacting with the augmented reality e-commerce platform 102 may be interested in collecting metrics from end users 116 and others and performing statistical analyses. This process is known as analytics. In this way, those entities may evaluate their processes. For example, manufacturers and retailers may evaluate sales and interactions of their products and presentations to end users 116. Content authors may choose to modify content based on feedback from end users 116. The platform 102 itself may use feedback from the end user 116 to optimize services. Analytics with the e-commerce augmented reality platform is described in further detail with respect to FIG. 7.

Example Environment for Augmented Reality E-Commerce

Figure 2:
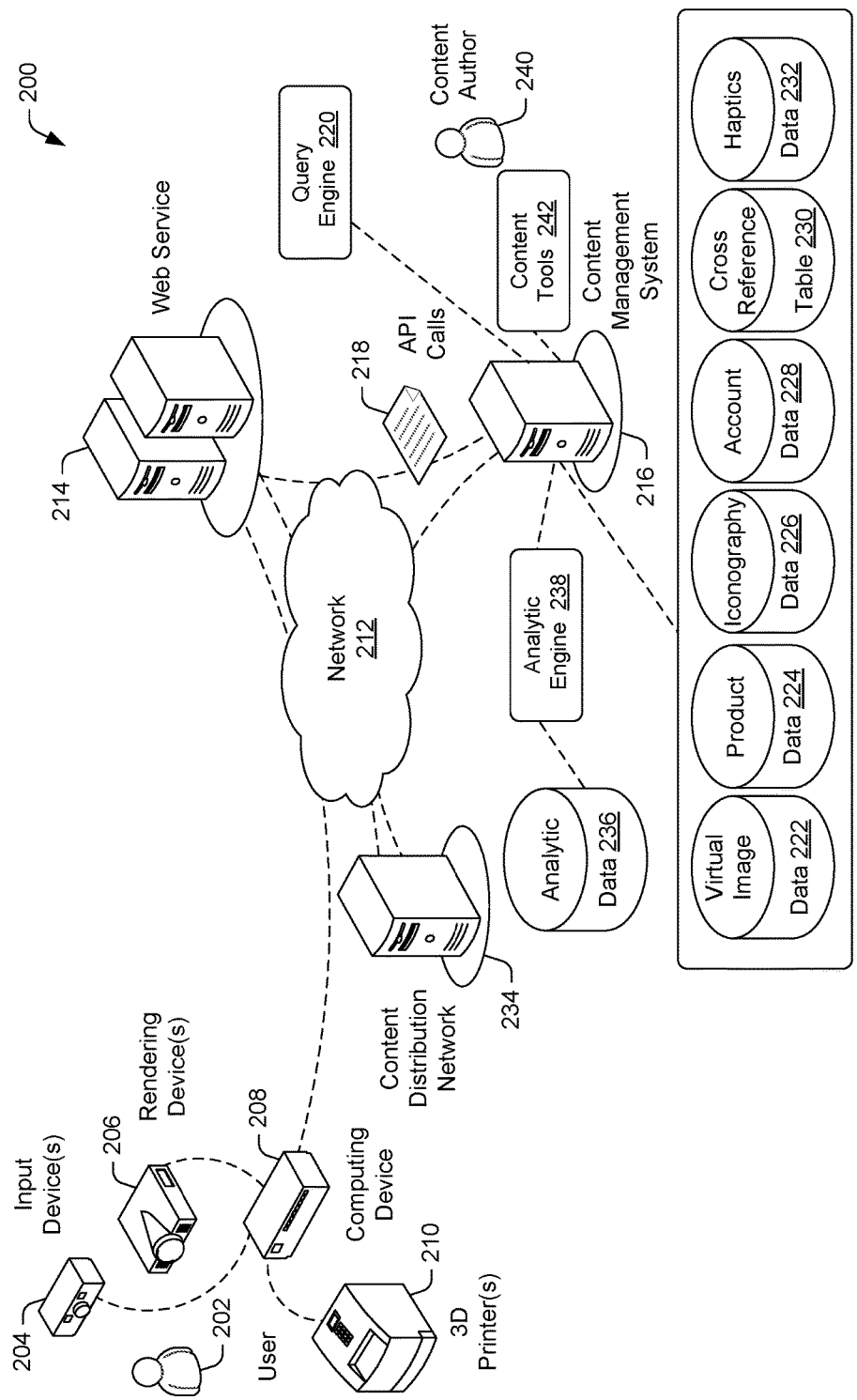
FIG. 2 is a diagram of an exemplary infrastructure for augmented reality e-commerce.

The hardware, software and communications environment is describe with respect to FIG. 2. Specifically, FIG. 2 is an infrastructure diagram 200 of an exemplary hosting environment for augmented reality e-commerce.

Prior to describing the exemplary hosting environment, a description of a computer and of computer readable media is provided as follows. Requests to the augmented reality e-commerce platform may be done from a client side device. A client side device may be any device with a processor, memory, and a network connection sufficient to connect to a cloud server, either directly or via the Internet. In most instances, there may be an operating system. Typical configurations are a central processing unit, RAM, and Wi-Fi or Ethernet connectivity. The memory may be computer-readable media and/or may have access to other computer-readable media, as described below, and may run a client application comprised of computer executable code resident in the memory and/or other computer-readable media.

Similarly a server, including a cloud hosted server, may be device with a processor, memory, and a network connection sufficient to connect to a client device or other server either directly, or via the Internet. As with a client device, typically there may be an operating system. Typical configurations are a central processing unit, RAM, and Wi-Fi or Ethernet connectivity. The memory may be computer-readable media and/or will have access to other computer-readable media, and may run one or more server applications comprised of computer executable code resident in the memory and/or other computer-readable media.

A server, including a cloud server, will generally run a virtualization environment that may create virtual machines. In each virtual machine, there may be an operating system, or system level environment. Each virtual machine may spawn processes, each of which may support at least one application. An execution environment such as a Java Virtual Machine, or .NET™ runtime may execute in a virtual machine and manage processes and threads.

Computer-readable media includes, at least two types of media, namely computer storage media and communications media. Computer storage media includes volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transmission mechanism. As defined herein, computer storage media does not include communication media.

Turning back to infrastructure diagram 200 of FIG. 2, end user, or user 202 for short, has access to a platform capable of accessing the internet and participating in augmented reality. There may be input devices 204, such as cameras, one or more rendering devices 206, a client computer 208, and potentially a 3D printer 210.

Input devices 204 may operate as part of the rendering devices 206, or may simply be input devices tracking the user 202 or the environment of the user. For example, a rendering device 206, may be, for example, Google Glasses or may be an augmented computer monitor. The glasses may have a camera to track what the user 202 is viewing. To do so, input devices 204, may include a head tracking depth sensor, eye tracking depth sensor, a microphone, perhaps for voice command, or other cameras to detect the user's gestures, reactions and facial expressions.

Since the platform 102 may support gesture input, input device 204 in the form of cameras may be trained on the user 202 to detect gestures. Furthermore, in the case of cameras used to detect the user's reactions and facial expressions, the input devices 204 may thereby be used to collect input for a cognitive modeling based analysis to determine the user's positive or negative attitude to the augmented reality environment and objects rendered.

Input devices 204 need not be specific to a user 202. Input devices 204 may include environmental cameras to detect lighting within the user's physical environment. Input devices 204 may also include microphones and environmental sensors. For example, microphones may be used as an input for noise cancellation to mute unwanted physical world sounds. A temperature sensor may be used to detect temperature which in turn could be used as an input to select virtual environment visual settings.

The client side portion of the platform 102 is agnostic to input devices. The platform 102 may equally support both virtual reality and augmented reality rendering devices 206. Accordingly, the platform 102 may equally support immersion or overlay rendering devices 206.

Rendering devices 206 are not limited strictly to video rendering via video screens. Rendering devices 206 may include haptic feedback via haptic gloves, force feedback via mechanical devices, and speakers to render sound.

Input devices 204 and rendering devices 206 are communicatively coupled to a computer 208. Logic to handle input and output, including device drivers and client applications are resident in the computer 208. Logic may include logic to parse gestures from a rendering device hereby to create computer commands. Logic may include logic to identify alternative forms of input, for example in support of the Americans with Disabilities Act (ADA).

In the case of ADA logic, a user 202 may set a preference in user logic to select modalities of input, or a set of predefined visual or auditory inputs comprising a distinct set of expressions. One modality may be finger gestures, another modality may be arm gestures, and a third modality may be voice commands. The logic stores a master set of computer commands. Each computer command corresponds to a computer routine or set of routines that are to be executed when the respective computer command is invoked. A user 202 may select a modality which creates a default mapping of the inputs comprising the modality to the master set of computer commands. Thus when the input is performed, the corresponding computer command is invoked, and the respective routine or routines are executed. The mapping of individual gestures to commands may be edited by the user 202 via a utility that allows manual mapping. Gestures from different modalities may be combined in a custom modality. For example, voice commands could be used for some computer commands and arm gestures for others.

Computer 208 may also be communicatively coupled to other devices such as 3D printer 210. A 3D printer comprises one or more heated nozzles feeding filament, typically plastic, and is used to create a sculpture as specified in a virtual file. The 3D printer 210 may thereby be used to turn virtual objects into physical objects, subject to scale and material constraints.

The client side components of the platform 102 access a network 212, usually the Internet, and thereby may access a web service 214. A web service 214 may be a web site, potentially for a manufacturer or retailer, where user 202 may browse goods for potential purchase. The web site 214 generally encapsulates logic to serve virtual goods, to track user accounts, to track and fulfil sales, and other commercial activities. To support these activities, the web service 214 will access virtual object assets and other assets from a content management system 216 over network 212 via API calls 218. The API calls 218 are described in further detail with respect to FIG. 3. Generally the content management system 216 will be owned by another entity. Accordingly, the web site 214, may render payments to the content management system 216.

The web site 214 may serve virtual objects via WebGL. However, if the web site 214 detects that either the user's rendering devices 206 or computer 208 do not support WebGL, or there are communications limitations, the web site 214 may encapsulate logic to fallback to alternative graphical rendering languages or representations. The web site 214 may determine that WebGL is not supported, for example via a user profile setting, a user selection from an application, or via querying an application resident on the client computer 208.

The content management system 216 is generally resident on a cloud provider, but alternatively may reside on local servers on a LAN. Upon receiving an API call from web service 214, such as a web site, the content management system 216 will service the request. The APIs are described in further detail with respect to FIG. 3. If the request is a query, a query engine 220 may be invoked. Alternatively, a query engine 220 may be resident in web site 214.

The API request may result in the content management system accessing data stores 222, 224, 226, 228, 230, 232 to serve the request. Where the request is to serve data, the content management system 216 may serve data on a Content Distribution Network 234, for subsequent access by the web service 214.

The content management system may allow a user to access one or more data stores. The data stores include virtual image data 222, product data 224, iconography data 226, account data 228, cross reference data 230 and haptics data 232 as described as follows.

Virtual image data 222 comprises all the data to display a virtual object. Virtual images are often referred to as virtual models, virtual assets or models for short. Model data is the data used to render a model. Virtual image data 222 comprise the identities of the models and the model data. Model data may include object files, rigging, meshes, textures, shaders, haptic textures, as well as other image data. In some cases, the data may be preprocessed in order to save processing time during rendering. Furthermore, provenance and versioning data may be associated with the models.

One feature supported by virtual image data 222 is an association with optional features for a product. Consider a product such as a chair. The chair may have different colors, textures, sizes, materials, or other options. The chair may be virtually modified by rendering with a selected option. In the case of model data, some features may be added. For example, one version of a chair will have arms, and the another version will not. Instead of creating model data of two separate chairs, the armless version may be stored and the arms virtually added during rendering. The model data for the option, in this case the arms, may be associated with the model data for the armless chair. When the user 202 selects the arms option, the content management system 216 would retrieve the virtual image data 222 for the arms.

Some options may include localizations. For example, a rendering of a television may display either American English sample content or Japanese sample content depending on the locale and preferences of a user 202.

Product data 224 comprise the commercial data associated with a model. Product data may include product names and identifiers such as Universal Product Codes and Stock Keeping Unit identifiers. Product data also includes user generated content such as ratings, reviews, metadata and links to relevant content such as unboxing videos, and other multimedia reviews. Product data may also include branding data, which is data provided by the manufacturer including logos, brand names, endorsements, and coupons.

One feature supported by product data 224 is a point of interest system. Specifically, a model will have points of interest to be called out to potential consumers, such that the user can obtain more information about that point of interest. The identity of the points of interest as well as the additional information content is stored as product data 224. By way of illustration, consider a shirt in the form of a model. It may be useful to have a point of interest to a seam that uses double needle tailoring. The product data would cross reference a point on the model, and would associate a discussion of double needle tailoring in the context of the shirt. When a particular command from an end user 202 to show the additional content is received, the content is retrieved from the product data 224.

Iconography data 226 comprises the set of data used to represent prompts and dialogs with a user. It comprises user interface data which includes user gesture patterns, mappings of gestures to user actions, data to enable behavior recognition via cognitive or other models, icons, common dialog boxes, common menus, standard widgets and gadgets.

Iconography data 226 enables the provision of a consistent user experience. For example, visual cues such as icons may be overlaid on a model, and since the visual cues all come from the same iconography database 226, the user 202 may become trained to recognize available options and activities indicated by the visual cues.

Account data 228 stores all identity information for a web service 214. Accordingly, account data 228 may include identity/account information, links to a method of payment, and preferences. In some cases, the web service 214 may also store identity/account information, links to a method of payment, and preferences, of end users 202 as well. This enables the possibility of the content management system 216 to provide fulfillment and tracking of transactions at an end user 202 degree of fidelity.

Cross reference table 230 enables the linking of virtual image data 222 to product data 224 or other third party data. The cross referencing may be via UPC, SKU or other indices. Furthermore, cross reference table 230 may also cross reference by a web service identifier, an end user identifier and/or a date time stamp. In this way, the data infrastructure for the content management system 216 may track all transactions of served data on a per web service, per end user, and/or per transaction basis.

A further degree of detail may be stored by the cross reference table 230. The web service 214 may track all input actions that are inputted by the end user 202 via the input devices 204. Thus the cross reference table may store a cross reference between one or more input actions in sequence and an action by the end user 202. In this way, the content management system 216 can correlate any action by an end user 202 to any transaction or sequence of input actions. This data is used later for analytics.

One of the end user 202 input devices 204 may be a haptic glove or other haptic feedback peripheral. The haptic texture library data store 232 enables haptic textures to be encoded onto virtual image data 222 or product data 224 in terms of texture information in the haptic texture library 232. The haptic texture library may include the following: one or more haptic textures, comprising a plurality of substantially flat polygon with one or more raised surfaces. Each polygon will have a predefined density of raised surfaces. A smooth surface may have little to no raised surfaces, whereas a rough surface may have a high density. Similarly, the amplitude of the raised surfaces may be specified. Smooth surfaces may have relatively low amplitudes, but rough surfaces may have relatively high amplitudes. The slope of a raised surface may also be stored. Steep slopes may represent prickly surfaces whereas shallow slopes may represent pebbled surfaces. The degree of give that a surface provides may also be stored. High degrees of give tend to be sticky, whereas low degrees of give tend to be merely rough.

The haptic texture library 232 polygons generally may be tessellated over a surface. Over a large surface, the same polygon may be flagged to repeat in a tessellation and may be flagged to have the orientation of the polygon randomly selected.

Since surfaces are not necessarily uniform, the haptic texture 232 may support overlay maps where the overlays indicate raised surfaces or depressed surfaces. In this way, scratches on a surface, or ridges of a surface may be expressed.

In rendering a surface, the surface is first subdivided into different zones indicating different types of textures. One or more patterns, and a polygon density for each zone is selected. The polygons are then tessellated onto the surface. If the repeat or random orientation flags are set, then the patterns are set accordingly. If an overlay is specified, then the overlay covers the surface, and scratches and ridges are rendered accordingly.

The content management system 216 is enabled via the cross reference table 230 and other data stores to track any and all 3D action by an end user 202. Sequences of actions, stored in analytic data 236, may be cross correlated against transactions and activities by an end user 202 via the cross reference table 230. By storing a date time stamp on activities, the content management system can track linger times between actions, which in turn may be used as part of cognitive and/or behavioral analysis.

Analytic engine 238 is coupled for analytic data 236 as well as the other content management system data stores 222, 224, 226, 228, 230, 232. The analytic engine provides an administrator with query and statistical analysis capabilities in order to detect behavioral patterns of one or more end users 202.

An important function of the analytic engine 238 is the determination of the success of an advertising campaign. For example, the analytic data 236 may indicate that a user reviews a virtual product such as a shoe. However, the analytic engine 238 may determine that the majority of users that look at the sole of a shoe end up not buying the shoe. A review of the virtual image data 222 may indicate that the model data of the sole is poorly aligned with the rest of the shoe. Accordingly, the owner of the model data may make the relevant data fixes.

Experiences for an end user 202 are generally created by content authors 240 via content tools 242. For example, a content author 240 would have done the fix to the shoe data in the example above. Content authors 240 may represent manufacturers or may represent retailers. The content creation process is described in greater detail with respect to FIG. 5 below.

Programmatic Overview

Figure 3:
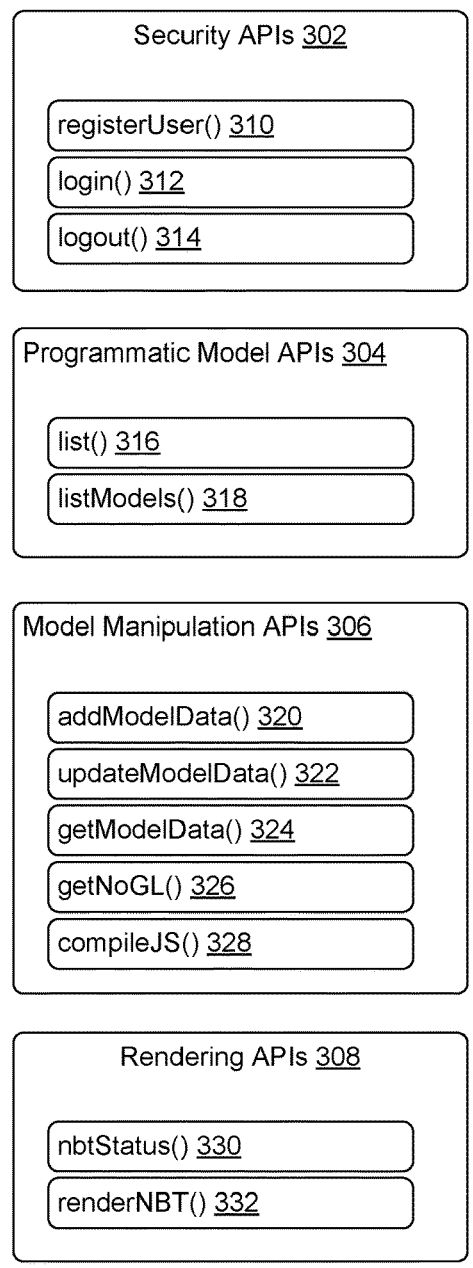
FIG. 3 is a diagram of an exemplary application programming interface block diagram for augmented reality e-commerce.

The content management system 216 exposes its functionality to web services 214 and other entities via an application programming interface (API). FIG. 3 is a block diagram of the functions exposed via the API. Specifically, the API exposes at least four blocks of functionality: security APIs 302, programmatic support APIs 304, model manipulation APIs 306, and rendering APIs 308.

Security APIs 302 provide authentication for an account for a party seeking access to the content management system 216. Accounts may be registered or deregistered via the registerUser( ) API 310. Calling this API creates, updates, or deletes data in the account data store 228. A session on the content management system 216 may be initiated via the login( ) API 312, and that session terminated via the logout( ) API 314. If the logout( ) API 314 is not called after a predetermined time, the content management system 216 will terminate the session independently.

Programmatic support APIs 304 provide convenience functions for programmers using the APIs 300 for the content management system 216. Programmatic support APIs 304 primarily provide enumeration functions of the API set 300 and of models. Specifically list( ) 316 enumerates the functions of the API set 300 and listModels( ) 318 enumerates the models accessible in memory.

Model manipulation APIs 306 provide functions to add, remove, and update data to models as well as to receive models. Specifically the model manipulation APIs 306 include addModelData( ) 320 which allows the uploading of data to a model; and updateModelData( ) 322 which allows the updating of data already in a model. Model data may be retrieved in GL library form via getModelData( ) 324. Received data may include virtual object data such as objects, shaders and textures. Received data may also include product data such as points of interest, pricing, and branding data. Yet other received data may also include slideshow data, scene data, and potentially third party data.

In the event a client is determined not to support the GL library, the getNoGL( ) 326 function may be called to use non-GL virtual data.

Model data comprise multiple files from multiple sources. Some data may be moderately sensitive. Accordingly, the model manipulation APIs include compileJS( ) 328 which takes the constituent model data files, makes it into a single file, and potentially performs an obfuscation function on the data. The obfuscation function makes it somewhat difficult to reconstruct the data if the data is intercepted.

Rendering APIs 308 provide functions to render data to a known quality of service. Specifically, the nbtStatus( ) 330 method allows a programmer to perform a performance check (NBT stands for Next Best Thing). Calling renderNBT( ) 332 renders the next best level of quality available to a client.

Data Service Process for Augmented Reality E-Commerce

Figure 4:
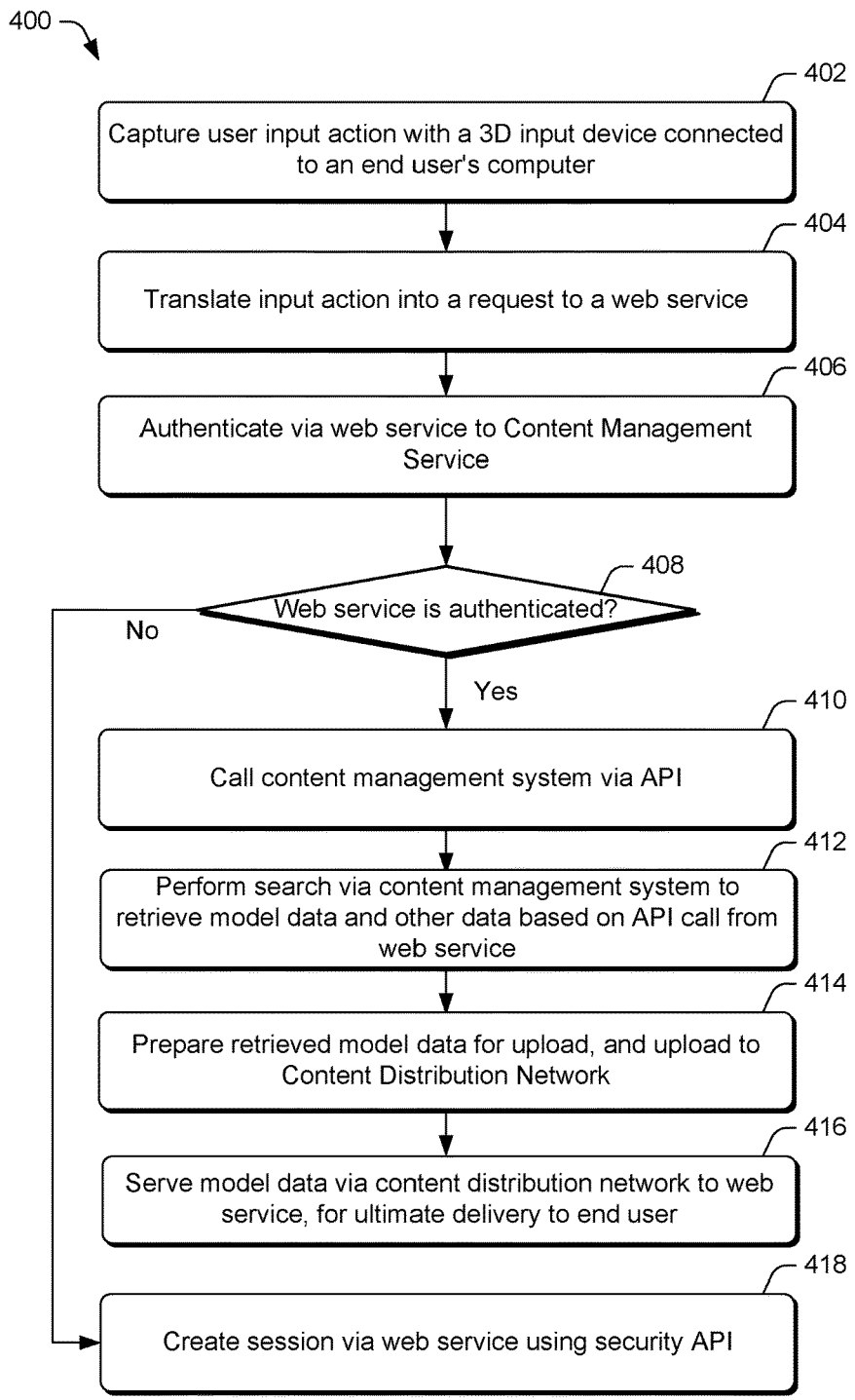
FIG. 4 is an exemplary service of content process for augmented reality e-commerce.

FIG. 4 provides a flow chart of a process 400 illustrating the content service cycle as part of augmented reality E-Commerce. At 402, an end user 202 provides input via an input device 204. The input may be tracked by client software such as a viewer, or by other tracking software local to the end user at the end user's computer 208. The end user's computer 208 is communicatively connected to a web service 214 over a network 212. At 404, client software sends any input corresponding to a data request for a model to web service 214.

The web service 214 calls the content management system 216 over the network 212, via one or more API calls 300. At 406, if the web service 214 is not authenticated ("No" at decision 408), process 400 may proceed to 418. At 418, web service 214 may create a sessions using the Security APIs 302.

However, if the web service 214 is authenticated ("Yes" at decision 408), then process 400 may continue to 410. At 410, the web service 214 may call one or more APIs 300 to retrieve model data. Typically the model data corresponds to the request for at least one end user 202. Alternatively, requests may be batched to minimize the number of network round trips between the web service 214 and the content management system 216.

At 412, the content management system 216 runs queries via query engine 220 to retrieve the requested model data from data stores 222, 224, 226, 228, 230, 232.

At 414, the content management system 216 constructs a single file for the retrieved model data, and deploys it in Content Distribution Network 234. Alternatively, the content management system 216 may serve the retrieved data model, either as a single file, or in multiple files, directly back to the web service 214.

At 416, the Content Distribution Network 234 serves the retrieved data either to the web service for forwarding to the end user, or potentially directly back to the end user's computer 208 for rendering via rendering device 206.

Content Authoring for Augmented Reality E-Commerce

Figure 5:
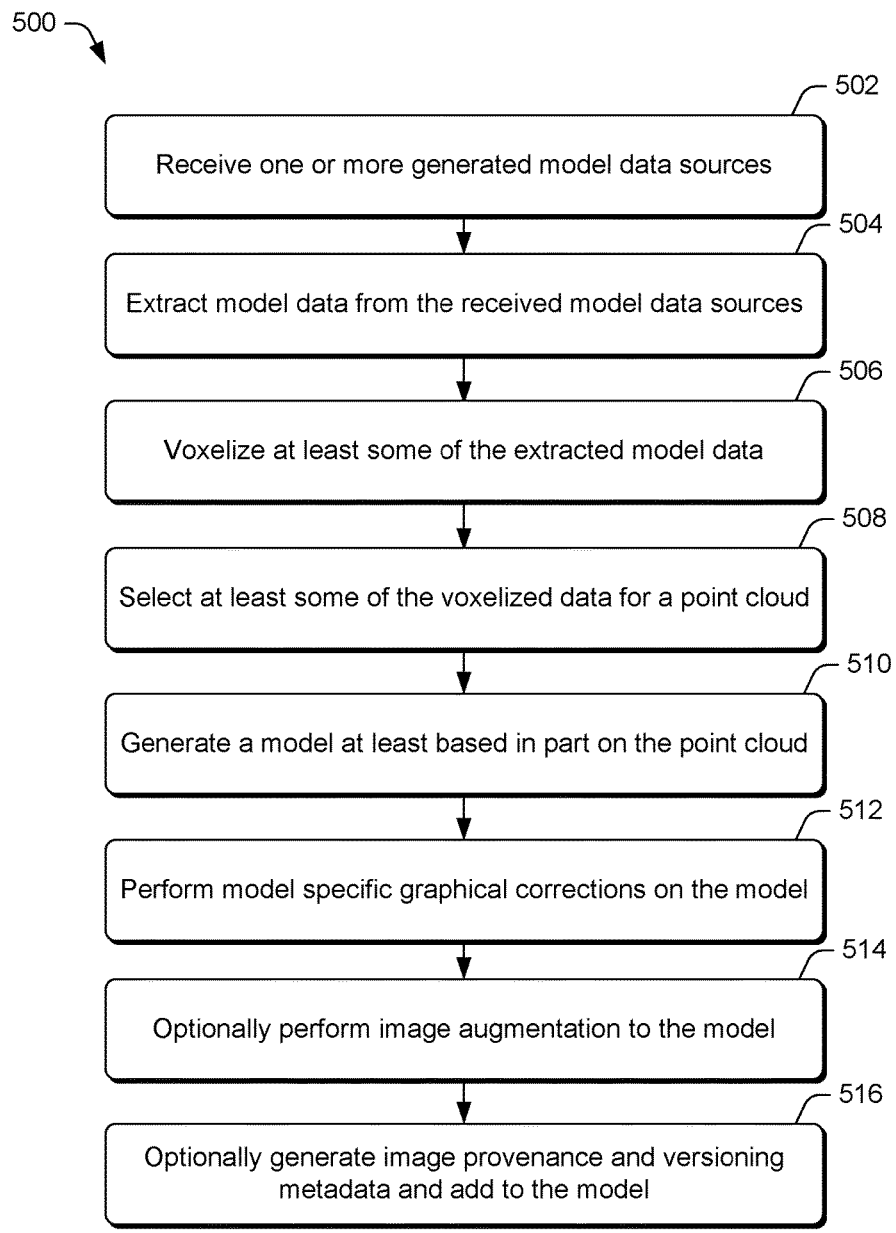
FIG. 5 is an exemplary content authoring process for augmented reality e-commerce.

The virtual image data 222 comprising the models may be authored by a content author 240 using content tools 242. A virtual image for a single product is a model, i.e., a graphical 3D virtual object to be rendered corresponding to the product. Because a typical manufacturer may have thousands of products, saving even a relatively small amount of time, such as five minutes, in capturing an individual image may result in a significant time and money savings. FIG. 5 is a flow chart of the content authoring process 500.

A model is generated from various model sources of data. Sources may include 3D scans, 2D images, metadata and textual content. At 502, a content author receives generated data sources for a model. A typical case is that the content author 240 is also the person to perform the 3D scans and other data capture. 3D scans may be performed using a photometric process. Textures can be captured and edited using standard editors such as Photoscan™, PMVS2 and similar software.

One of the more time intensive steps in generating a model is to ensure the model may be usable as a 360° spin representation. Conventional mounting techniques where mounts are hidden behind the product cannot be effectively used, since the back of the product will be imaged as well. Conventionally, a content author 240 may mount a product from the back, scan the front, then remount the product on the front and scan the back. However this effectively doubles the amount of time to scan the object since mounting accounts for most of the capture time.

In general, the content authoring tools 242 may incorporate other functionalities that lower the amount of time to perform a scan. For example, content authoring tools 242 used in scanning are to utilize higher end graphical processing units (GPU), and to used motion control systems to decrease mounting time.

An alternative mounting technique is to have a boom hold the object with a thread into a light box. Once the object is still, a 3D scan and/or 360° panoramic series of photos may be taken without the mounting being visible, and without multiple mountings being performed.

Soft goods, such as apparel, also present a challenge. Typically, an end user 202 may desire to virtually wear a virtual clothing object. Thus the object cannot be scanned as folded. Rather the object is placed on a special mannequin that is completely covered by the object. For example, a shirt is held in a mount that comprises only a torso and arms as long as the sleeves. This differs from a conventional mannequin that would also show arms, and potentially a head. Accordingly, the specialized mounts may minimize any surface area that would be subject to a 3D scan.

Another issue in generating a 360° spin representation is to obtain uniform lighting. To address this issue, a content author 240 may use a computer numerical control (CNC) boom to hold a camera and primary lighting. The object to be scanned may be in a light box with standalone lights, but a primary light may be held by the boom holding the camera. In this way, as the CNC boom is programmed to capture a series images of the object while revolving about the object, the primary light on the boom provides a constant lighting contribution.

At 504, once the data sources have been generated or received from third parties, the data is extracted from the data sources. At 506, the data is voxelized, or converted into voxels. Note that a voxel is a volumetric pixel—the 3D analogue for a 2D pixel.

At 508, at least some subset of the voxelized data is selected for a point cloud corresponding to the object. The voxelized data may optionally be used to generate a virtual 3D mesh for the object. The 3D mesh is a computerized wireframe of the surface of the object. The mesh is used to project images, lighting, and other image data to generate the 3D graphical likeness of the object.

With the point cloud and other generated data, the data is finally consolidated in 510 into a model. As previously described above, a model may comprise, an object file, a mesh, a series of images, other maps, and other assets used to generate a virtual image of the object.

When generating a model, another time bottlenecks is in 512 where the content author 240 performs model specific corrections. Corrections may include the following issues.

Errors during 3D scan may yield mesh errors and accordingly yield a bad topology. Such errors may be corrected by hand, or automatically detected. For example, scans of similar products could be compared to flag areas that are different. For example a scan of a first shoe, known to be correct could be compared to a second shoe. If the second shoe indicates a spike not in the first shoe, the spike may be flagged as an anomaly. In such cases the spike could turn out to be a mount that was inadvertently scanned, and the content author 240 may remove the spike.

Images may be misaligned when added to a mesh. Typically a series of 2D images taken of the object are projected onto the 3D mesh. However, sometimes 2D images do not project properly on the mesh. Software may scan the borders of objects and automatically seek misalignments. For example, a standardized scan of a tailored shirt would expect seam lines around pockets, the collar, and the sides of the shirt. Software could scan for broken seams in the model indicated misaligned images.

In addition to potential misalignment, different 2D images projected onto a mesh may have been captured with slightly different lighting causing non-matching color. As described above, software may scan the borders and overlaps of 2D images and test for non-matching color. Where detected, the colors may be blended on the model or the original 2D images changed.

3D scans may be used to capture the shape of an object. In order to make a photorealistic model, a content author 240 may build a specular map from the data. The specular map may capture the lighting properties of the object, in particular the shininess/reflectiveness of the object. In general, pictures taken of the object could be used to extract material properties of the object.

Once the model has been corrected, it may be used as virtual image. However, in 514, the content author 240 may opt to perform image augmentation. For example, if the object is something that might be printed locally, such as with a 3D printer, the content author may wish to add mounting to the object.

Furthermore, the content author 240 may opt to provide image provenance or versioning in 516. Metadata for image provenance is used when using third party data sources, where copyright and other image ownership is to be tracked. Versioning is used to track iterations of the model itself. As time goes on, the model is likely to undergo modifications and corrections. Such modifications and corrections may be tracked by a versioning data.

User Experience Process for Augmented Reality E-Commerce

Figure 6:
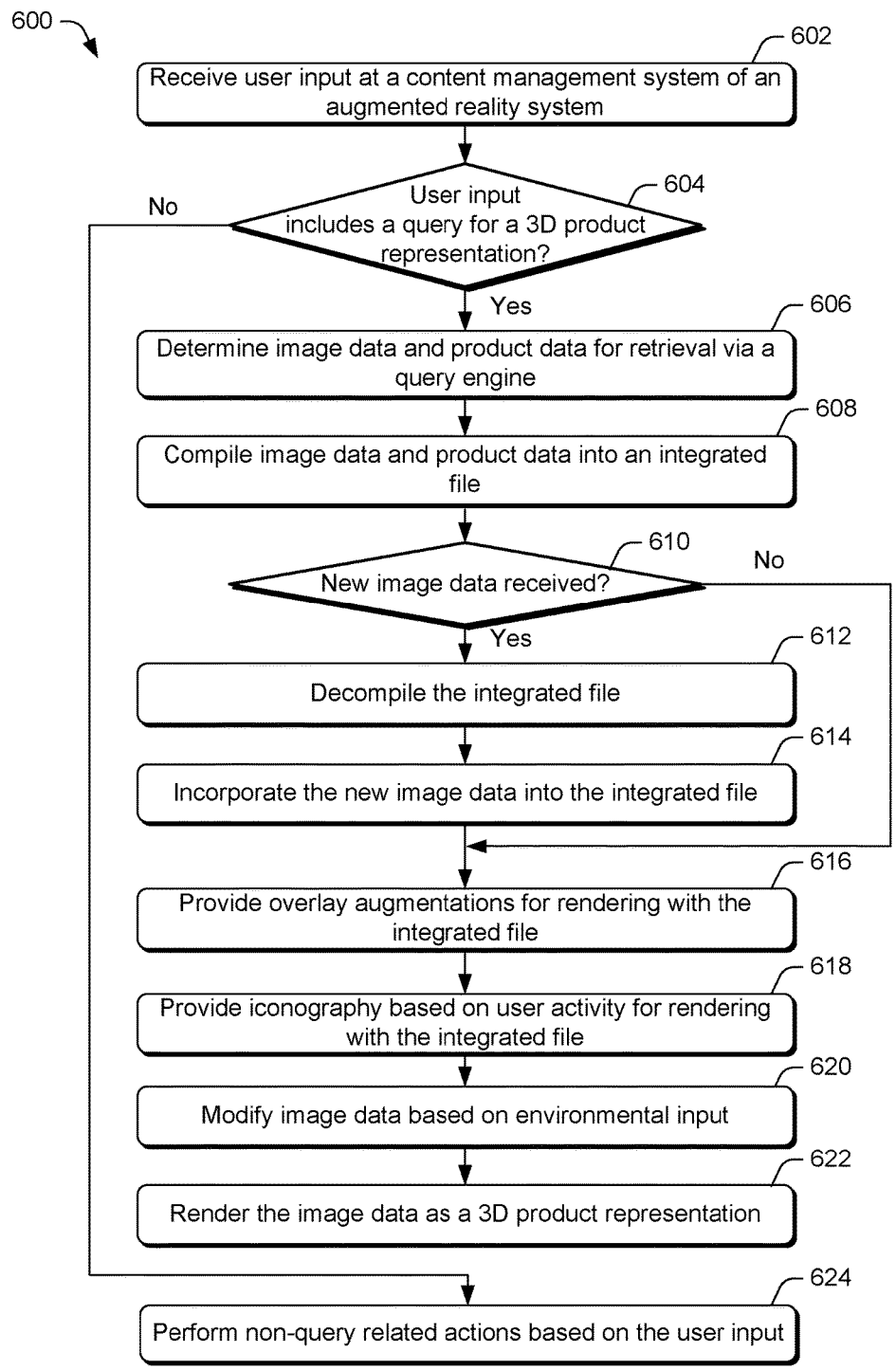
FIG. 6 is an exemplary user experience process for augmented reality e-commerce.

FIG. 6 is an exemplary process 600 that provides an augmented reality e-commerce experience to a user. At 602, the web service 214 may receive user input from a user as captured by the input devices 204. The input devices 204 may include cameras, microphones, touch surfaces, wearable sensors, or other sensing devices that are configured to capture motions or actions of the user. For example, the user input may include specific gestures made by the user via the user's arms or hands, gestures made using the fingers (e.g., a pinch command), selection of virtual icons, and/or voice commands. In some embodiments, the input devices 204 may be configured to capture motions or actions that are performed by persons with disabilities. Such motions or actions may include movement of facial features (e.g., winking of eyes, twitching of facial muscles), blowing of air through a person's mouth in specific patterns, movement of limbs or head in particular ways, and/or so forth. In some embodiments, the input devices 204 may have logic to translate such inputs into commands. Such commands are then passed by the input device 204 to the web service 214.

At decision 604, the web service 214 may determine whether the user input includes a command to perform a query for a particular 3D product representation. In various embodiments, the web service 214 may include command processing logic that recognizes query commands. For example, the input devices 204 may translate a touch gesture or a voice command regarding a particular product into a command. In turn, the command may be recognized by the command processing logic of the web service 214 as a query command Thus, if the user input is recognized at decision 604 by the web service 214 as a query command ("Yes" at 604), the process 600 may proceed to 606.

At 606, the web service 214 may pass the query command to the query engine 220 of the content management system 216. In turn, the query engine 220 may determine image data and product data that are to be retrieved in response to the query command. In various embodiments, the web service 214 my pass the query command to the query engine 220 via an API call, such as one of the API calls 218. The query engine 220 may parse the query command to determine a 3D product representation of a product that is to be retrieved. Upon making such a determination, the query engine 220 may retrieve image data for the selected 3D product representation. For example, the query engine 220 may retrieve the image data from the virtual image database 222. The image data for the product may be linked to the product data for the product. The linkage may be through a common product identifier, such as a Universal Product Code (UPC) that is shared by the image data and the product data. The product data may include audio product data, multimedia product data, product identification information, product specifications, product inventory information, product price information, product shipping information, and/or so forth. The product data may be stored in the product database 224.

At 608, the content management system 216 may compile the image data and the product data that are retrieved by the query engine 220 into an integrated file. The compilation into the integrated file may serve to obfuscate the content of the file. For example, the content management system 216 may use a compilation tool, such as the compileJS( ) API call, to perform the compilation of the integrated file.

At decision 610, the content management system 216 may determine whether new image data is received. In various embodiments, the content management system 216 may receive new image data as part of a general update to the virtual image database 222 or a specific update to the image data for the product that is the object of the query command. For example, the new image data may be a correction to the existing image data or additional image data that is previously unavailable for the product. Accordingly, if the content management system 216 determines that new image data is received, the process 600 may proceed to 612.

At 612, the content management system 216 may decompile the integrated file for the product that is the object of the query command. The content management system 216 may use the compilation tool or an equivalent software tool that is compatible with the compilation tool to decompile the integrated file. The de-compilation of the integrated file may once again expose the image data and the product data.

At 614, the content management system 216 may incorporate the new image data into the integrated file. In various embodiments, the integration may be performed with the supplementation of the image data with the new image data. For example, if the image data is stored in the form of multiple data files that are catalogued via a master file list, then the name of a new file that includes the new image data is placed in the master file list. However, if the image data is a single data file, then the new image data may be appended to the data file at the end of the existing image data, or appended at one or more appropriate places in the data file. Once the new image data and the existing image data are merged, the content management system 216 may use the compilation tool to compile the image data and the product data into an integrated file. Subsequently, the content management system 216 may transmit the integrated file to the rendering devices 206.

In some embodiments, the incorporation of the new image data into the integrate file may be performed by a rendering device, such as one of the rendering devices 206. In other words, the content management system 216 may offload this task to the rendering device. The rendering device may perform such incorporation after receiving the integrated file and the new image data from the content management system 216. In such embodiments, the rendering device may be equipped with de-compilation and compilation tools, as well as processing logic for performing the incorporation of the new image data into the integrated file. Returning to decision 610, if the content management system 216 determines that no new image data is received, the content management system may directly transmit the integrated file to the rendering device 206.

At 616, the content management system 216 may provide augmentations that are to be rendered along with the integrated file to the rendering devices 206. The augmentations may include points of interest, color swatches, visual textures, and additional product information. The augmentation may be provided in the form of an augmentation data file to the rendering devices 206. The points of interest may be selectable features that are overlaid onto a 3D product representation. The selectable features may further explain or highlight specific features of the product. For example, when a user selects a particular point of interest, additional details regarding a specific feature may be rendered or displayed as part of the 3D product representation. In some embodiments, the content management system 216 may tailor the points of interest to a user based on user profile information, such as prior purchase history, prior product browsing history, user demographic information, user social media expressions, and/or so forth.

The color swatches may be rendered as a part of the 3D product representation. The color swatches may serve to provide additional color options for a product that may capture the interest of the user. For example, a 3D product representation for a footwear may have a default color. In such a scenario, the color swatches may be selected to modify the default color into other colors. Likewise, the visual textures may be rendered as a part of the 3D product representation. The visual textures may serve to provide additional visual options for the product that may appeal to the user. For example, textures such as stainless steel, wood, polished aluminum, leather, chrome, and brushed nickel may be texture options that are selected and rendered for different aspects of the 3D product representation.

Additional product information may be rendered with the 3D product representation to inform the user. In various embodiments, the additional product information that is provided by the content management system 216 may be localized for the user. For example, the additional product information may be a translation of a product name or product description that is displayed according to the geographical region from which the user is viewing the representation. The geographical region may be determined via a global position system (GPS) locator, an IP address of the rendering devices 206, cellular triangulation, and/or other technologies. The additional product information may also be localized to meet governmental regulations and standards. For example, the additional product information may include health warnings, manufacturing information, usage information, or other appropriate labeling data. Other product information that may be rendered with the 3D product representation may include product reviews, product ratings, related products, user comments, associated social media trends, and/or so forth.

At 618, the content management system 216 may provide iconography for rendering with the 3D product representation to the rendering devices 206. The iconography may be provided based on user activity, and can be provided in the form of an iconography file that can be rendered along with the 3D product representation. The iconography data may be stored in the iconography database 226. For example, the content management system 216 may be aware that the user has looked at the 3D product representation several times in the past or has placed the 3D product representation in a virtual holding place. Accordingly, the content management system 216 may provide iconography in the form of a virtual buy button that is to be displayed with the 3d product representation. In some instances, the virtual buy button may be accompanied by a custom tailored discount offer to further encourage the user to make the purchase. In another example, the content management system 216 may be aware that the user has been looking for a product with a particular feature. Accordingly, the content management system 216 may provide iconography in the form of virtual highlighting (e.g., semi-transparent amber overlay) that draws the attention of the user to a particular feature shown in the 3D product representation.

At 620, the content management system 216 may command shaders on the rendering devices 206 to modify the way in which they present the image data based on environmental input. In various embodiments, the shaders may augment the image data with occlusions, reflections, refractions, and/or other visual effects. Such modification may enable the rendering device 206 to present the 3D product representation in an enhanced virtual reality or an augmented reality. In such embodiments, the input devices 204 may include cameras and/or wearable locators that detect the eye position, orientation, and movement of the user. Input devices such as cameras and scanners may also detect and map the placement of objects in a real environment. The cameras may further detect lighting conditions, which may light source positions, light level, light temperature, and/or other lighting parameters in the real environment. Based on these inputs, the rendering devices 206 may modify the image data of the product for presentation in an augment reality that is visible through the real environment, or for presentation in a virtual reality that simulates the real environment. For example, occlusion includes hiding certain surfaces of an image from view, reflection is the duplication of at least a portion of image to simulate optical effects, and refraction is the splitting of light into its constituent waves.

At 622, the rendering devices 206 may use the shaders to render the image data into a 3D product representation, as well as render the augmentations for the 3D product representation. The rendering device 206 may render the 3D product representation into a rendered augmented reality environment or a rendered virtual reality environment. In various embodiments, the rendering devices 206 may implement one or more optimizations for the rendering. In some embodiments, the shaders may be configured to skip the rendering of image data for visual surfaces that are blocked by other visual surfaces or objects in the foreground. In other embodiments, the rendering devices 206 may pre-rendering certain image data (e.g., the background of the virtual reality environment) to speed up the rendering process.

Returning to decision 604, if the user input is not recognized by the web service 214 as a query command ("No" at 604), the process 600 may proceed to 624. At 624, the web service 214 may parse a non-query related user command from the user input and process the user command accordingly. For example, if the user command is a command to rotate or manipulate a rendered 3D product representation, the web service 214 will pass the command to the rendering devices 206. In some embodiments, the manipulation may be performed with a locked field of view so that the 3D product representation may be presented from the correct perspective. However, if the user command is a purchase command, the web service 214 may process the purchase transaction for the product that is represented by the 3D product representation.

Augmented Reality E-Commerce Use Cases

Figure 7:
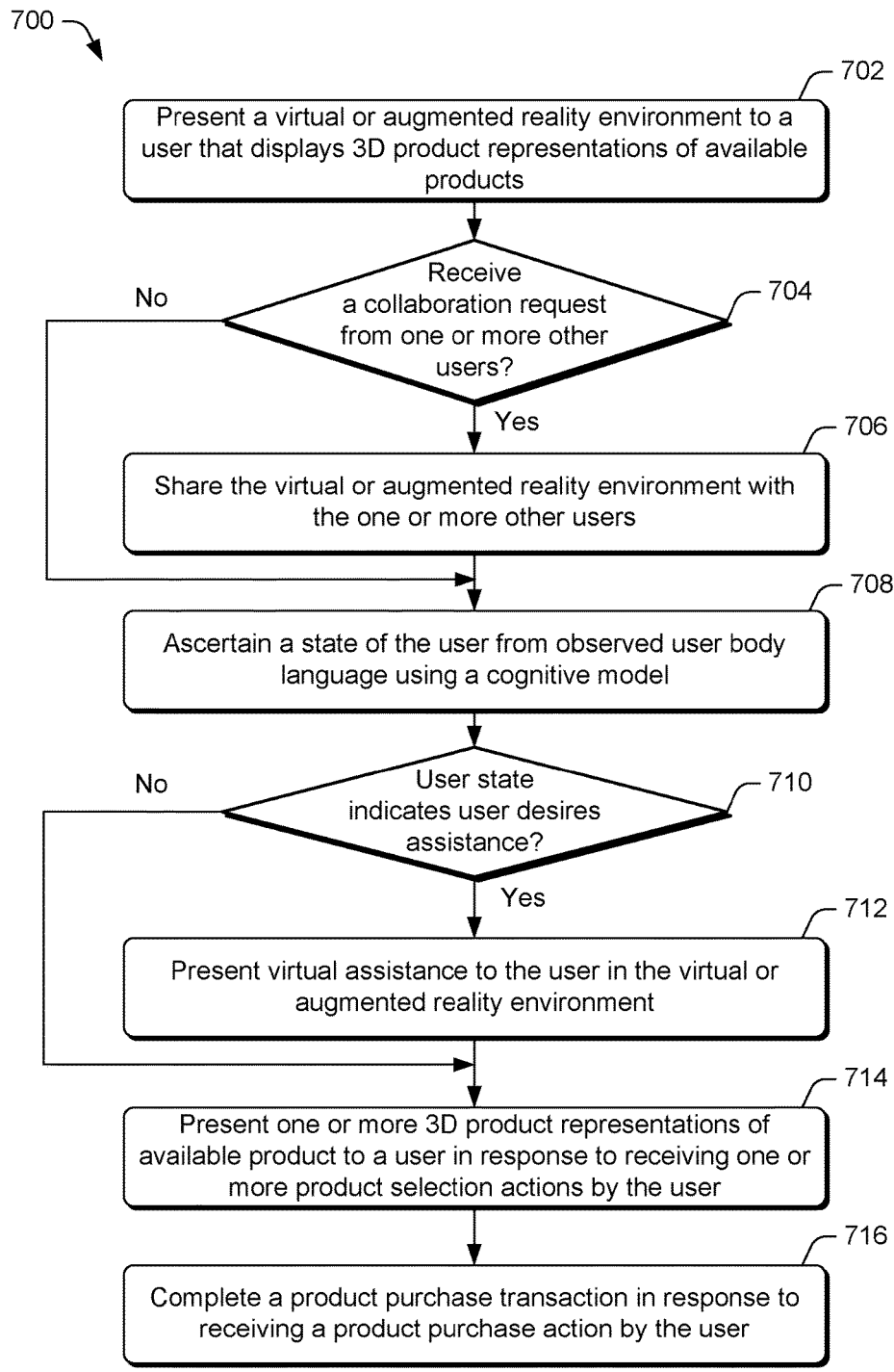
FIG. 7 is an exemplary search process for augmented reality e-commerce.

FIG. 7 is an exemplary search process 700 for augmented reality e-commerce. At 702, the web service 214 may present a virtual or augmented reality environment to a user that displays 3D product representations of available products. The web service 214 may present the environment by sending virtual or augmented reality image data, product image data, and product data from the content management system 216 to the rendering devices 206. The image data and the product data may be sent from the content management system 216 to the rendering device 206 via the web service 214. The 3D product representations may be presented in a way that enables a user to browse and learn about the available products. In some embodiments, the 3D product representations may be presented as a cover flow. The cover flow may enable the user to sweep through the 3D product representations via user inputs to the input devices 204. The cover flow may provide the user with an experience of flipping through the products. The user inputs may include gestures, voice commands, body movements, facial expressions, selection of virtual icons, etc. In other embodiments, the 3D product representations may be presented via other sequential data presentation techniques, such as a slideshow.

The 3D product representations of products may be displayed in the cover flow or other sequential presentation according to the amount of slotting fees paid by each product vendor or manufacturer. For example, the cost of placing a 3D product representation at a beginning or end of a sequential presentation may be higher, as users typically remember objects at the beginning or end of a sequence better than objects that are in the middle of the sequence. In another example, 3D product representations that are visually prominent may cost more in terms of slotting fee than other 3D product representations. A 3D product representation may be made more visually prominent because of its size, color, resolution, description, etc., relative to such characteristics of the other 3D product representations.

In various embodiments, the 3D product representations may be presented with product data. Such product data may include price information, brand information, and/or user generated content. The user generated content may include product reviews, product commentaries, user product ratings, as well as other user generated information. Such user generate content may assist the user in learning more about the products, evaluating the products, and making purchase decisions with respect to the products.

At decision 704, the web service 214 may determine whether a collaboration request is received from the one or more other users. A collaboration request may initiate a session in which an additional user is able to share in the same virtual reality or augmented reality experience with the user. Accordingly, the additional user may view the same the 3D product representations in the same environment. In some embodiments, the additional user may also have the same ability to control the flow and manipulation of the 3D product representations. According, if the web service 214 determines that one or more collaboration requests are received at decision 704 ("Yes" at decision 704), the process 700 may proceed to 706.

At 706, the web service 214 may initiate a sharing of the virtual or augmented reality environment with the one or more additional users. In various embodiments, the web service 214 may prompt the rendering devices of each additional user to retrieve the appropriate virtual or augmented reality environment data, product image data, and product data from the content management system 216 for presentation. The virtual or augmented reality environment may be fully interactive, such that each additional user may communicate with the user in the environment, as well as control the 3D product representations using corresponding input devices. The virtual or augmented reality environment data may also include avatar image data, such that the user may see a virtual or an augmented representation of the additional user, and vice versa. However, if the web service 214 determines that no collaboration requests are received ("No" at decision 704), then the process 700 may proceed directly to 708.

At 708, the web service 214 may ascertain a state of the user from observed body language. The observed body language may include facial expressions, body movements, hand gestures, and/or so forth. The web service 214 may receive the body language through the input devices 204. In some embodiments, the web service 214 may process the body language using a cognitive model to determine the state of the user. The state of the user may be one of contentment, sadness, frustration, displeasure, anger, happiness, etc. In other embodiments, the web service 214 may process the body language using other forms of machine learning and classification techniques. For example, a classifier may be trained using various approaches, such as supervised learning, unsupervised learning, semi-supervised learning, naïve Bayes, Bayesian networks, decision trees, neural networks, fuzzy logic models, and/or probabilistic classification models to determine the state of the user.

At decision 710, the web service 214 may determine whether the state of the user indicates that the user desires assistance. In various embodiments, assistance may be triggered if the detected state of the user is one of frustration, displeasure, anger, or some other relevant state. Thus, if the web service 214 determines that the user desires assistance ("Yes" at decision 710), the process 700 may proceed to 712.

At 712, the web service 214 may present the virtual assistance to the user in the virtual or augmented reality environment. The web service 214 may provide the virtual assistance by providing image data, audio data, and multimedia data from the content management system 216 for presentation by the rendering devices 206 to the user. The virtual assistance may be provided by an automated avatar assistant that is programmed to respond to voice queries from the user with machine generated answers. Alternatively, the virtual assistance may be provide by a virtual representation of a real human assistant who is able to offer help and guide the user. In still other embodiments, the web service 214 may initially provide automated assistance, but escalates to real human assistance if the automated assistance is unable to provide the user with a satisfactory resolution. However, if the web service 214 determines that no user assistance is desired at decision 710 ("No" at decision 710), the process 700 may proceed directly to 714.

At 714, the web service 214 may receive a product selection action by the user. In various embodiments, the user may make a product selection via an interaction with the corresponding 3D product representation that is sequentially presented. For example, the user may select the product by making a pinch gesture on the 3D product representation or virtually touching the 3D product representation. In turn, the web service 214 may present an in-depth version of the 3D product representation. The in-depth version of the 3D product representation may include additional features or show more information than the initial representation. These features and information may include augmentations (e.g., selectable points of interest, selectable textures and colors, iconography), supplementary descriptions, and custom tailored offers. The web service 214 may present the in-depth version based on data retrieved from the content management system 216. The user may manipulate and view the 3D product representation using different angles, perspectives, zoom factors, lighting conditions, alternative views, etc. For example, if the user is looking at a vehicle, the alternative view includes additional accessories that may be installed on the vehicle. Likewise, colors may be overlaid on the 3D product representation to show alternative color options.

The rendering devices 206 may include a haptic feedback device that is able to provide haptic feedback with respect to the physical textures of a product represented by a 3D product representation. The haptic feedback information may be stored in the haptic database 232. For example, the haptic feedback device may be a glove or another article of clothing worn by the user. In at least one embodiment, the haptic feedback device is able to provide physical texture feedback using electrical impulses. The haptic feedback device may simulate physical textures that have various degrees of smoothness, roughness, temperature, etc. In some instances, the haptic feedback device may also provide force feedback to simulate product response to manipulation. For example, bending the sole of a virtual shoe may cause the haptic feedback to simulate the elasticity of the sole and the ability of the sole to return to its original shape. In various embodiments, the web service 214 may receive multiple product selection actions and provide corresponding in-depth versions of the 3D product representations and feedback.

The presentation of the in-depth 3D product representations may involve the use of a virtual mirror. In some embodiments, the virtual mirror may be implemented using rendering devices (e.g., a 3D display) that presents a virtual representation of the user with the product. For example, if the product is a piece of clothing, input devices 204 may capture a 3D virtual likeness of the user. The web service 214 may then graft the 3D representation of the clothing onto the 3D virtual likeness of the user for display by the rendering devices. In this way, the user may be free to view product and the virtual likeness from multiple angles (e.g., 360° degree spin), in order to make a purchase decision.

In other embodiments, the virtual mirror may be implemented using rendering devices in the form of 3D display goggles or helmet. The 3D display goggles or helmet may be equipped with input devices in the form of cameras that capture a real-time image of the user. In such embodiments, the web service 214 may digitally enhance or augment the real-time image of the user so that the 3D display goggles or helmet are digitally erased from the user's head. Such digital enhancement or augmentation may be perform using a 3D image of the user's head from when the user is not wearing the 3D display goggles or helmet. This implementation, which uses 3D display goggles or helmet, may enable the user to look at the 3D likeness of the user with the 3D representation of the product in a virtual mirror, as well as look at the user's own body with the product in an augmented reality view. For example, if the 3D representation is that of a pair of shoes, the user will be able to see a 3D image of himself wearing the 3D representation of the shoes in the virtual mirror, as well as look down to see the 3D representation of the shoes on his or her own feet.

At 716, the web service 214 may receive a product purchase action from the user. The user may make the purchase action by making a predetermined gesture, such as virtually pressing a virtual buy button that is instantiated with the 3D product representation of the product. The gesture may be capture by the input devices 204 and transmitted to the web service 214. In turn, the web service 214 may initiate and complete a product purchase transaction for the product.

In some instances, the product being purchased by the user may not be a product that the user is looking at in a current purchase session. Instead, the product may be a something that the user looked at previously and virtually saved in the virtual or augmented reality environment. In one scenario, the virtual or augmented reality environment may include virtual holding place where the user can store 3D product representations of interest (e.g., products that the user is contemplating to purchase). Accordingly, the user is able to retrieve a 3D product representation and purchase the corresponding product in the same manner as other products. In some embodiments, special offers or discounts may be sent to the user by the web service 214 on behalf of manufacturers or vendors in the virtual or augmented reality environment to further motivate the user to make a purchase.

The purchase transaction may be completed using various transaction instruments, such as a credit card, a debit card, an electronic checking account, a gift card, a digital wallet, etc. Data related to such transaction instruments may be stored in the account database 228. The web service 214 may use a transaction engine to process the purchase transaction. Subsequently, the product may be electronically delivered to the user if the product is a virtual or non-tangible good. Otherwise, if the product is a physical good, then the product may be physically delivered to the user or picked up by the user. In some embodiments, the transaction engine used by the web service 214 may implement security measures with respect to the purchase transaction. For example, the transaction engine may cause an input device in the form of a camera to obtain a scan of the user's face, or a retinal scanner to obtain a scan of the user's eye. The transaction engine may then authorize the transaction if a scan match stored scan data belonging to the user. Other security measures concurrently or alternatively implemented by the transaction engine may include the input of correct security codes, passwords, personal identification numbers (PINs), etc.

The transaction engine may also implement purchase transaction security through the use of behavior data as stored in the cross reference table 230. In such implementations, the transaction engine may flag purchase attempts that do not fit existing user behavior patterns or user profile information as potentially fraudulent. For example, a purchase of a product for delivery to a different part of the country may be flagged. In another example, a purchase of accessories for a product that the user does not own may also trigger a flag. The transaction engine may enable the user to confirm a flagged purchase transaction via additional user authentication, such as telephone, web, or email based identity verification. Through the use of these behavior-based security measures, the transaction engine may prevent or mitigate identity theft and fraudulent purchases. The transaction engine may also support auditing functions, such as the viewing of purchase histories, payment histories, delivery histories, etc., by the user and other authorized parties.

The web service 214 may record aspect of the user browsing, selection, and/or purchase experience for replay by the user or another authorized party. In some implementations, the user may desire to review the various features of the product that the user browsed. Accordingly, the user may select a virtual record feature that is present by the web service 214 in the virtual or augmented reality environment to record a manipulation of the 3D product representation. Subsequently, the user may reactivate the virtual or augmented reality environment and replay the manipulation of the 3D product representation via a replay option. In other implementations, the user may desire the share a browsing and/or purchase experience with another user. The web service 214 may once again be activated to record the manipulation of the 3D product representation, which may include a purchase of the corresponding product. The recorded data file may be shared with another user, and the other user may view the recorded data file in a virtual or augmented reality environment as a replay of the user's experience.

Analytics for Augmented Reality E-Commerce

The analytic engine 238 may track user browsing and manipulations of 3D product representations as well as the user purchases of the products represented by the 3D product representations. The tracked information may be stored in the analytics database 236. The tracking of user manipulation of the 3D product representation may include tracking the orientations, scales, and/or directions at which the user viewed the 3D product representation, as well as user facial features and gestures used during the manipulation. Camera angle with respect to the 3D product representation, user dwell time at each of the orientation, scale, angle, and/or direction, features or descriptions selected or view are also tracked. The tracking of user purchase information may include the purchase price, the number of times the user viewed the 3D product representation before making a purchase of the product, offers or incentives associated with the purchase, and/or so forth. Accordingly, the analytic engine 238 may generate metrics based on the tracked information.

In various embodiments, the metrics may indicate what aspects of the 3D experience was difficult for the user to understand. For example, a user repeatedly selecting a virtual control in the virtual or augmented reality environment within a predetermined time period may indicate that the user is unclear as the functionality of the virtual control. The metrics may indicate products that most captures each user's interest. Such metrics may be determined based on a frequency that users view particular 3D product representations, dwell time on specific 3D product representations, whether the user saved a 3D product representation for later viewing, and/or so forth. Conversely, the metrics may also indicate the dislikes of users. For example, a 3D product representation that is placed prominently in a cover flow for a user in which the user never views may be an indicated that the user dislikes the product. In another example, one or multiple instances in which user gestures or facial impressions show frustration or anger while viewing a 3D product representation may also indicate that the user dislikes the corresponding product.

The metrics may also reveal the actual driving force in the user making a purchase. For example, the metrics may indicate that average user dwell time and/or purchases by a group users on a 3D product representation increased or decreased after a change. The change may be the additional or removal of certain image data, overlaid information, or iconography from the 3D product representation. The metrics may also show the most frequently viewed 3D image, description, or augmentation prior to purchase of a product by a group of users. Such statistics may be used to increase or maintain the number of sales for a product.

The analytic engine 238 may also provide replay of the user experiences with the 3D product representations. The replays may be performed per user, per product, or per purchase. The replay of the purchase decisions of the individual users may serve to visually identify common patterns in the purchase decisions as well as the visual imagery that may have motivated the purchase decisions.

The analytic engine 238 may also show points of interest in the 3D product representations that are viewed or ignored by the users. By collecting viewership statistics across a group of users and cross referencing this information with purchase data, the analytic engine 238 may identify points of interests that do not contribute to purchases or otherwise distracting users from making purchases. Further, the analytic engine 238 may identify points of interest that are to be removed. For example, a point of interest regarding a product that is ignored by predetermined percentage of users who purchased the product may be removed from presentation by the analytic engine 238. The removal of a point of interest for a product may provide an opportunity for the addition of another point of interest for the product. The point of interest to be added may be similar to a point of interest that has worked well for a comparable product (e.g., viewed by a predetermined percentage of users that purchased the comparable product). In some embodiments, the analytics engine 238 may automatically relay the points of interest removal and addition instructions to the web service 214.

In some embodiments, the analytic engine 238 may use the tracked information to provide recommendations of additional products to users. For example, if a user prefers goods of a particular manufacturer, type, style, price point, brand, etc., the analytics engine 238 may communicate this information to the web service 214. In turn, the web service 214 may provide recommendations of similar products to the user during a subsequent visit of the virtual or augmented reality environment by the user. The analytic engine 238 may also use the tracked information to recommend a virtual reality environment to the user based on the user's product purchases. For example, the analytics engine 238 may recommend to a user that buys traditional furniture items a virtual environment that resembles a Tudor-style private study, while a user that purchases modern furniture items may be recommend an industrial loft style virtual environment. The analytic engine 238 may provide such recommendation to the web service 214 for implementation using 3D image data upon approval of the user.

Further, the analytics engine 238 may compare the user return visit rate or conversion rate for purchases made as result of 3D experiences in a virtual or augmented reality environment to purchases that result from other sales techniques. Based on such comparison, the analytic engine 238 may generate metrics and statistics that show the effectiveness of the virtual or augmented reality environment in promoting products. The metrics and statistics may show comparisons of time to conversion, impressions per conversion, cost per conversion, customer visit gain or loss rate, and/or so forth. In some instances, such metrics may be used to sign up additional manufacturers or vendors for the 3D virtual or augmented reality e-commerce platform.

Augmented Reality e-Commerce for Home Improvement Stores

Augmented reality e-commerce methods may be useful for home improvement store chains that offer appliances, products, and services for buildings. The appliances, products, and services may be used for remodeling, as well as repairing homes, offices, and other properties such as yards and building facades. For example, a person may come to a home improvement store to begin the process of remodeling their kitchen. Accordingly, a user may wish to visualize a layout of a remodeled kitchen with new appliances and receive guidance and instructions for doing the remodel work themselves. Conventionally, renderings may be viewed on print-outs or via an interactive computer generated model on a screen. However, these experiences may not offer a level of visualization necessary for making educated decisions related to design and purchases.

Furthermore, a customer may benefit from visualizing constraints and limitations related to prospective purchases or projects. For example, an appliance to be purchased may not fit through the front door and another entrance may need to be used for delivery. Similarly, the appliance may need certain connections related to electrical and plumbing. Accordingly, the ability to address these issues during the design and visualization phase may save time and frustration during delivery and installation.

Further, a customer may seek do-it-yourself (DIY) advice and how-to guidance from home improvement store chain websites. Similarly, home improvement stores often provide ideas and suggestions in order to promote their products and services. Customers and home improvement stores would benefit from a way to increase the level of immersion for DIY guidance and from the ability to have a remote specialist provide detailed assistance and instruction.

A user may wish to make a change to an environment, which may be a home, office, store, restaurant, yard, or landscape. With an augmented reality device, the user may be able to visualize possible changes to the environment using the disclosed systems and methods for augmented reality e-commerce.

In some embodiments, a commercial entity may send a sales representative to a property in order to help a customer make an educated purchase of a product offered by the commercial entity. The sales representative and customer are wearing separate equipment which may be augmented reality headsets, each of which may comprise an input device 204, a rendering device 206 and a computing device 208. Either user may additionally use a device such as a mobile phone or a tablet to aid in actions such as selecting a product for rendering and in closing a sale.

One input device 204 may capture environment data in an area of a property in which a customer wishes to visualize a placement of a product or object. The area may be a home or an office owned or leased by a customer. Captured environment data may be stored locally within the memory of computing device 208 and may be transferred via network connection or later upload to storage in virtual image data

222. Each user may be prompted with an option to sanitize environment data captured. For example, image data of pictures on the surface of a captured refrigerator image or items atop a captured countertop image may be sanitized from the captured environment data via a gesture.

A user may decide that there is data to be sanitized, and data is sanitized from the captured data before being stored. Alternatively, sanitization may be prompted by content management system during later access. A product may be selected for augmented reality rendering within the captured environment. A 3D image of a product may have been scanned by 3D imaging technology and stored within virtual image data 222. The product image may have been previously downloaded onto a computing device 208 to be rendered by an augmented reality headset. A product image may be pre-selected by the sales representative based on a customer preference. Alternatively, a product may be pre-selected automatically based on data relating to popular products, customer preferences or behavior. A product may additionally be pre-selected based on an analysis of the captured data.

The augmented reality software may have a particular method for visualizing product images, such as those for a dryer, dishwasher, or refrigerator within an environment. For example, utilizing infrared spatial data of the room gathered by an input device 204, such object images may appear to "magnet" directly to or at an adjustable distance from surfaces such as walls, ceilings, and floors. Additionally the selection of a particular product may prompt additional information to surface. For example, selecting and rendering a refrigerator may prompt a user to consider where a power outlet may be located nearby. Placing selected images in an environment with the magnet effect may be done by a user pointing or gesturing in a pre-defined manner.

A rendering limitation may arise due to the processing power necessary to render complex 3D images within an augmented reality environment. Objects to be rendered may be prioritized dynamically by a user and may be prioritized automatically via an algorithm if there is no specified user preference. Multiple objects may be rendered giving highest priority to customer selected objects, then to objects selected by sales representatives, then to objects prioritized by an algorithm Additionally, object image data may be pre-cached using a prioritization algorithm Rendering may occur only one object at a time, while lower priority objects may appear in wireframe only, to conserve power.

Each augmented reality headset captures pre-defined gestures, motion by the sales representative and the customer, and customer behavior. This data may be used to contribute to making better automated product recommendation predictions or to enhancing user experience.

A computing device 208 may identify key points and constraints relating to interaction of product objects with the captured environment data. Key points and constraints may be limitations relating to available doorways for moving appliances and furniture, necessary modifications to walls and countertops, and objects which may need to be added or deleted to accommodate products.

Information relating to products or environment may be rendered and overlaid into augmented reality view. For example, metadata may be filtered, manipulated, and interacted with by a user. Metadata may be product points of interest or data relating to an environment, such as power sockets, load bearing walls, and studs within walls. Other objects that may be overlaid are drawings, notes, and objects made by a customer or sales representative. Objects overlaid, added, and/or manipulated by a customer may be indicated with a different color and/or style from that of objects overlaid, added, and/or manipulated by a sales representative.

A customer may consider purchasing a selected item or plurality of selected items. The customer may place a selected item into an e-commerce cart and continue to consider more products before finishing the shopping experience, and may begin again by selecting another product to be rendered or choosing to render a product pre-selected to be rendered.

The customer may then choose to make a purchase. The purchase may be made within the augmented reality user interface, or may be updated to a system for a user to make an in-store or online purchase. Additionally, information relating to manifest, shipping, or physical constraints of the environment may be sent to delivery personnel.

The disclosed processes may facilitate a sales process by allowing a user to visualize new products superimposed within the actual space the product would inhabit, such as a kitchen or living room. The disclosed processes may be utilized by an augmented reality system such as Hololens™ or Magic Leap™ Alternatively, this use case may be adapted for a virtual reality system since the environmental data is captured.

The disclosed augmented reality e-commerce processes may greatly enhance the ability of a customer seeking products, services, and guidance related to home improvement to make educated purchase decisions. Additionally, the disclosed processes may allow a home improvement store to more effectively present to a customer design ideas tailored to a customer's home as well as deliver how-to advice and guidance using augmented reality technology.

Capturing Environment for Home Improvement E-Commerce

Figure 8:
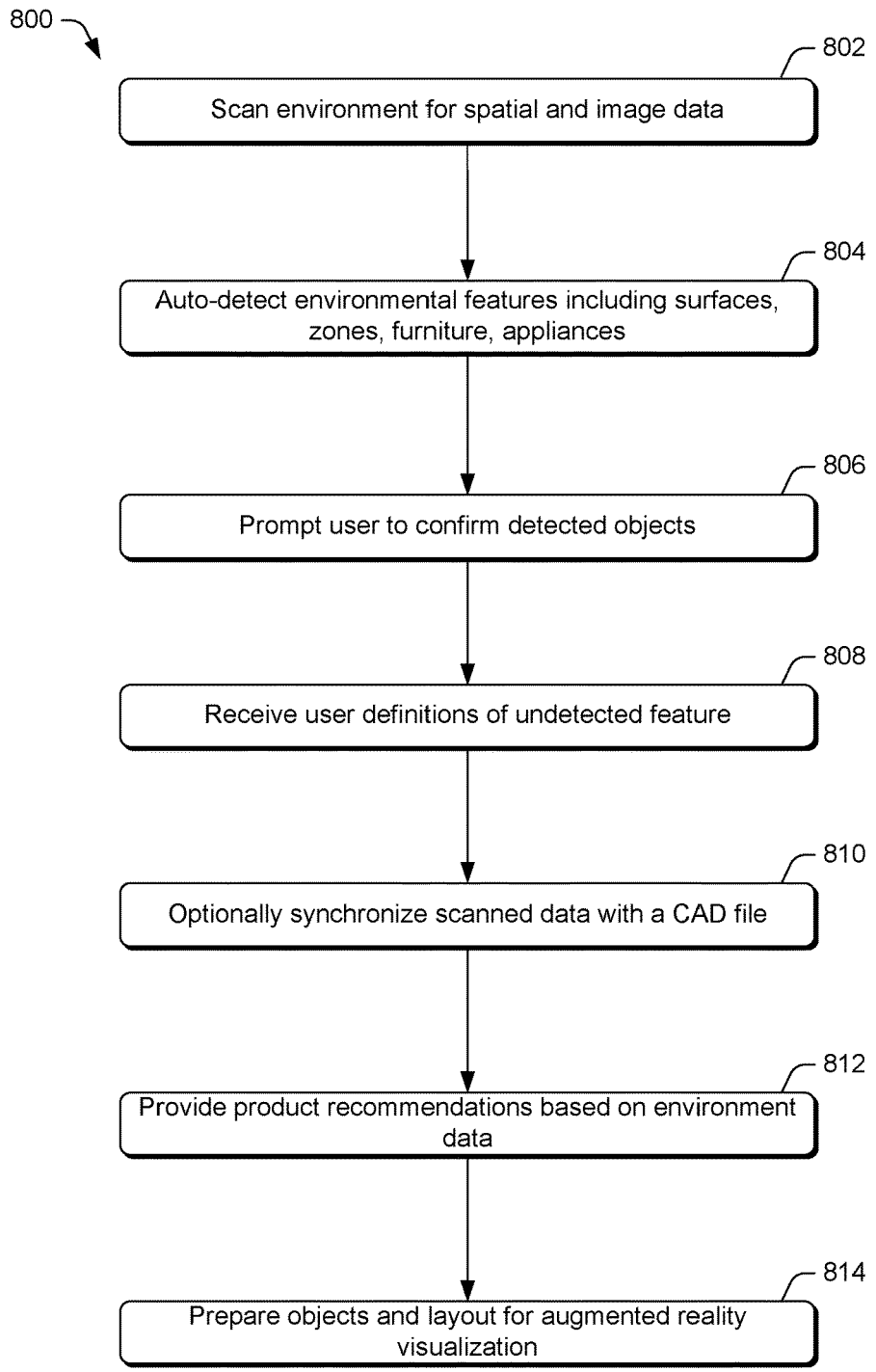
FIG. 8 is an exemplary process for preparing captured environment data for augmented reality e-commerce.

FIG. 8 is an exemplary process 800 for preparing captured environment data for augmented reality e-commerce. At 802, a sensor may be operated by a user to scan an environment such as a kitchen or bedroom to detect spatial data and image data. Scanned environment data may be stored locally on computing device 208 or in virtual image data 222. Sensors for scanning an environment may be an input device 204 that may be a part of an augmented reality device or may be a separate input device using high quality sensors and methods for high fidelity scanning and environment mapping, such as an array of infrared sensors.

At 804, scanned environment data may be processed by a computer such as computing device 208 to make measurements of surfaces and objects in the scanned environment. Additionally, environmental features in the scanned environment may be detected by recognizing patterns in the spatial and image data acquired from the scan. An environmental feature may be any object or surface in a room detectable by scanning equipment. Detected environmental features may be surfaces, zones, furniture, appliances, and any other objects features that may be related to desired products or services.

In order to prepare for an augmented reality e-commerce experience for home improvement, a user may view and confirm the automatically detected environmental features in the scanned environment data by using a tablet or a computer, or by using an application within an augmented reality experience.

For example, at 806, a user may be prompted by software to confirm the features (e.g., objects, surfaces, etc.) that were automatically detected by computing software in 804. At 808, a user may select a surface or object within the scanned environment and choose to define the surface or object as a feature that may be related to a desired project, product, or service.

In some embodiments, a CAD file of the scanned environment may be provided. For example, a new office building may have a detailed CAD file created by architects and engineers for construction of the building. The CAD file may detail electrical and plumbing features related to a scanned environment. At 810, a user may synchronize a CAD file and its relevant metadata to the scanned environment data. Synchronizing may be done automatically or by a synchronizing method involving at least selecting reference points within the CAD file and scanned environment. This data may be stored in virtual image data 222 or locally on a computing device.

At 812, computer software compare the environment data gathered in steps 802 through 810 to virtual image data 222 and product data 224, in order to provide to a user recommendations of products and services that may fit the scanned environment. For example, the software may provide recommendations for a dishwasher unit for a scanned environment defined as a kitchen and having a zone with electrical connections and plumbing connections.

At 814, a device such as a computer or tablet is used to prepare layouts and objects to be visualized within an augmented reality experience. In various embodiments, the device may prepare the layouts and objects in response to an input from a user. In this step, the user may be an interior designer using an interface on a computer screen to place virtual 3D objects, i.e., 3D virtual representations, around a scanned environment for a user to later view within an augmented reality headset. Similarly, a user may use an interface on an application on a tablet device to specify objects to be viewed later using an augmented reality headset.

Additionally, at steps 812 and 814, at least one image file may be pre-cached on the local memory of the augmented reality device by being downloaded via content management system 216 from virtual image data along with its relevant product data from product data 224. Due to the large size of 3D image files, pre-caching may save time. Objects may be chosen for pre-caching automatically as in step 812 or manually by a user as in 814.

Augmented Reality Home Improvement E-Commerce

Figure 9:
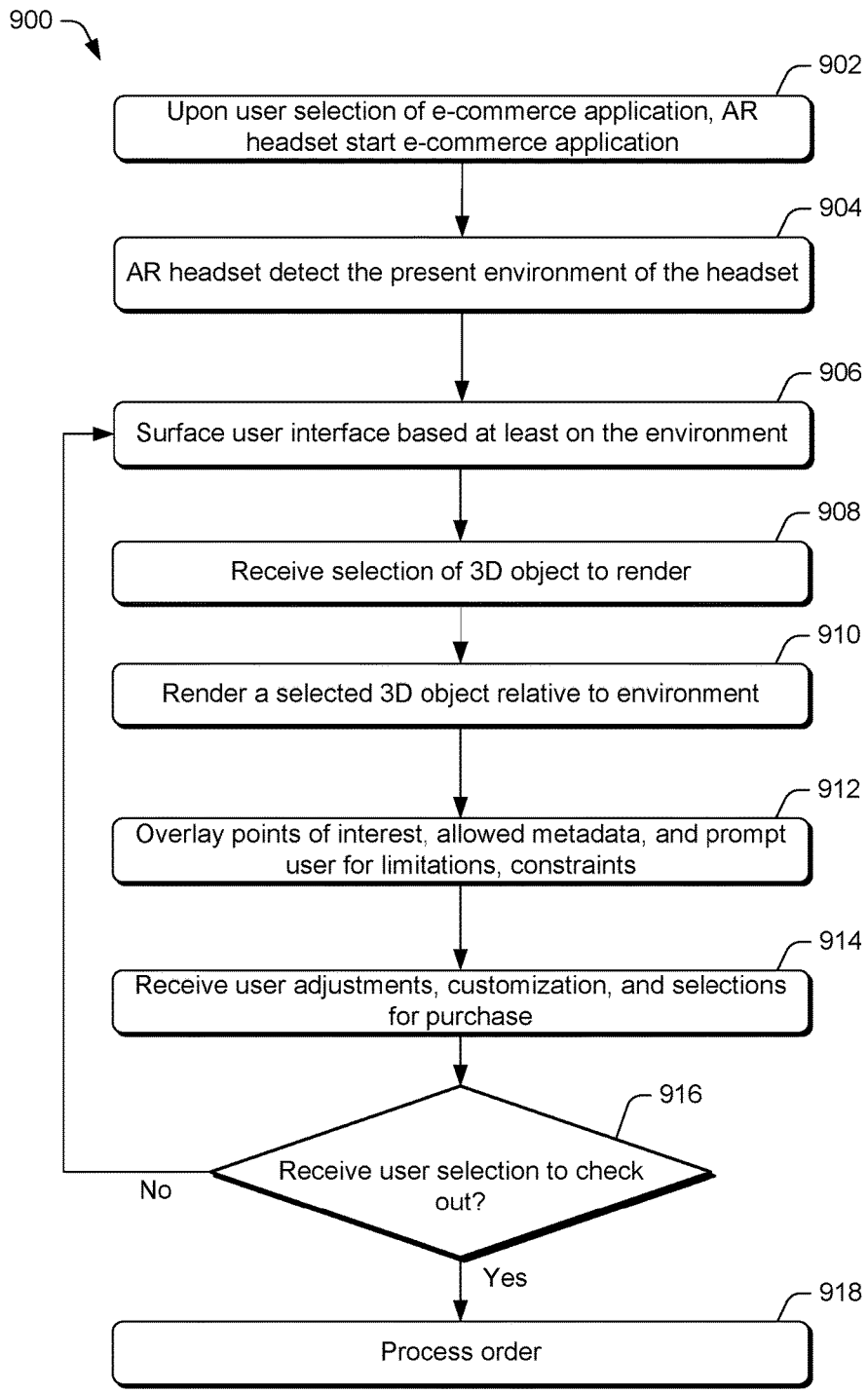
FIG. 9 is an exemplary process for augmented reality e-commerce for a home improvement store.

FIG. 9 is an exemplary process 900 for augmented reality e-commerce for a home improvement store. A user may be wearing an augmented reality headset device connected via Wi-Fi to the network 212. At 902, an augmented reality e-commerce application is initiated by a user, and connects to the web service 214. In turn, the web service 214 is connected to the home improvement store's content management system 216. The user may select an option to start an application for e-commerce for a home improvement store via the augmented reality headset device.

At 904, using at least the positional tracking functionality of the augmented reality headset, the augmented reality headset may detect the environment (e.g., room, zone, etc.) in which the user is currently using at least one input device 204. If a previously scanned environment is not automatically detected in step 902, a user may specify within the application the room which is to be the setting for the augmented reality e-commerce experience.

At 906, the augmented reality e-commerce application may surface a user interface that has options that may be based on previously scanned environment data. For instance, for a user who has already provided scanned environment data for a utility closet with an old washing machine and dryer unit, the application may surface a user interface which prominently features a recommended washing machine and dryer unit which may each fit the dimensions of the scanned environment.

Additionally, the menu may be based on previous user account activity. For instance, for a user who has previously viewed ceiling fans for their living room, the application may surface a user interface which prominently displays an option allowing a user to view recently viewed items.

At 908, an augmented reality e-commerce application may receive a user's selection from the user interface display which calls for rendering at least one 3D object. At 910, the application may render the at least one 3D object in the augmented reality environment. An exemplary rendering process is described in further detail in FIG. 10.

At 912, the application may surface an overlay of points of interest and data relating to the at least one 3D object rendered in step 908. At 914, the augmented reality headset may provide a user interface for adjusting, customizing, and selecting purchase options for the at least one 3D object.

At decision 916, the augmented reality headset may receive indication from the user that the user is ready pay for purchase selections. If the user is not ready to make a purchase ("No" at decision 916)), the process 900 may return to 906. Accordingly, the user may be able to select another option for viewing another at least one 3D object. However, if the user is ready to make a purchase ("Yes" at decision 916), the process 900 may proceed to 918.

At 918, the augmented reality headset may allow the user to complete the order within the e-commerce application. Optionally, the e-commerce application may relay the purchase selections to another system for processing purchase orders.

Rendering 3D Objects in Augmented Reality E-Commerce

Figure 10:
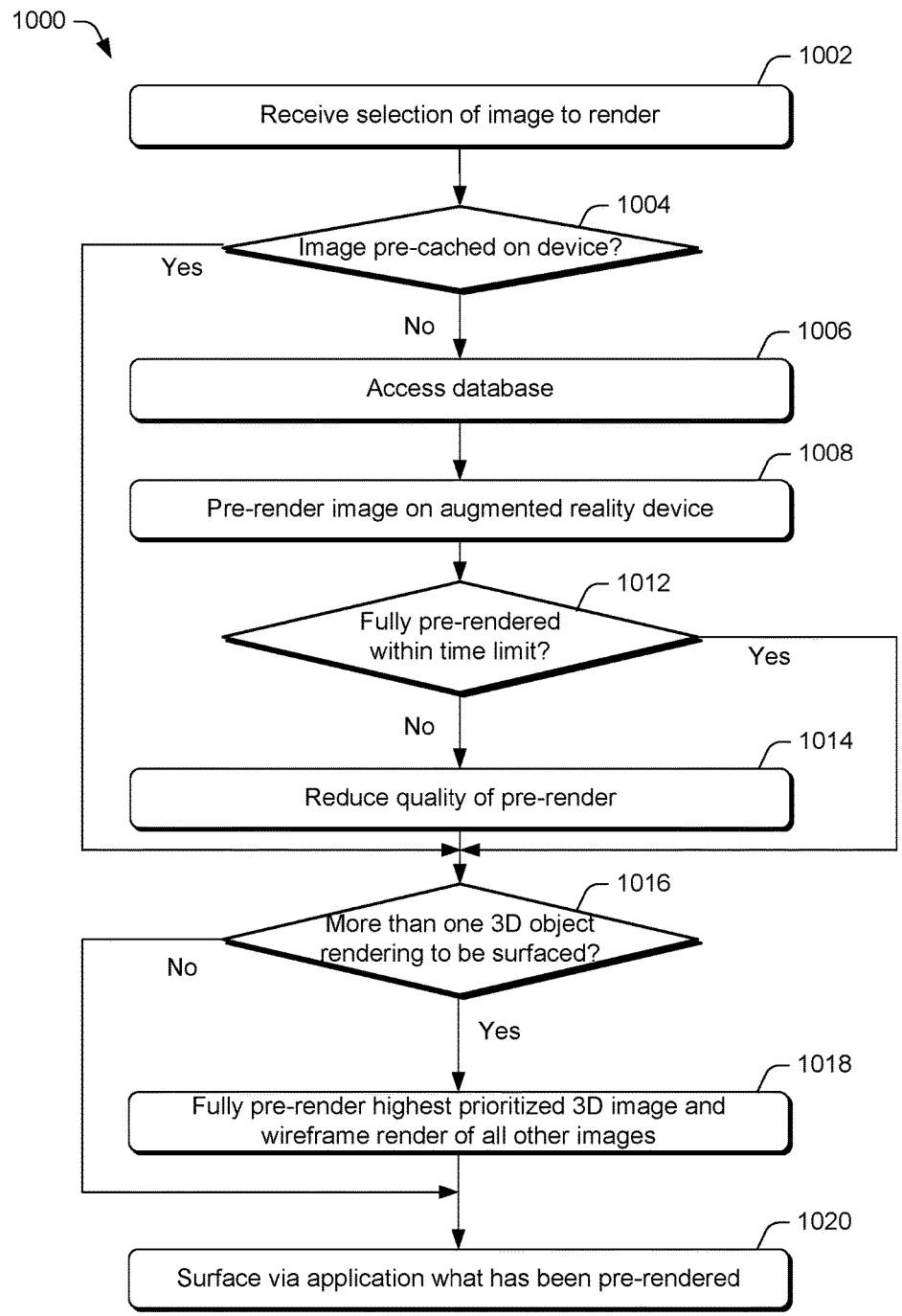
FIG. 10 is an exemplary process for rendering 3D objects in augmented reality.

FIG. 10 is an exemplary process 1000 for rendering 3D objects in augmented reality. At 1002, an augmented reality e-commerce application may receive a user's selection from the menu an option which calls for rendering at least one 3D object. At decision 1004, the application may detect whether the selected 3D object image had been pre-cached on the local memory of the augmented reality device as described in 812 and 814.

At 1006, if at least one 3D object has been pre-cached ("Yes" at decision 1004), the process 1000 may proceed to decision 1016. However, if at least one 3D object has not been pre-cached ("No" at decision 1004), the process 1000 may proceed to 1008.

At 1008, the application may pre-render an image within the local memory of the augmented reality device. The application may impose a pre-specified time limit for full pre-rendering. At decision 1012, if the application has not fully pre-rendered at least one 3D object ("No" at decision 1012), the quality of the pre-render may be lowered as in 1014. However, if the at least one 3D object has been fully pre-rendered ("Yes" at decision 1012), the process 1000 may proceed to 1016. At 1016, the application may detect whether more than one object is to be rendered.

Additionally, if at 1004 at least one 3D object has been detected to be pre-cached on local memory of the augmented reality headset, the application may detect whether more than one object is to be rendered as depicted in decision 1016. If only one object rendering is to be surfaced ("No" at decision 1016), the application may surface the pre-rendered object.

However, at 1018, if more than one object rendering is to be surfaced ("Yes" at decision 1016), the application may fully pre-render the highest prioritized 3D image and pre-render wireframe renderings of all other images. The application may have a prioritization algorithm for rendering multiple 3D images. The prioritization algorithm may prioritize highest the file most recently selected by the user. At 1020, the application may surface pre-rendered images in the context of the environment.

3D Object Manipulation in Augmented Reality E-Commerce

Figure 11:
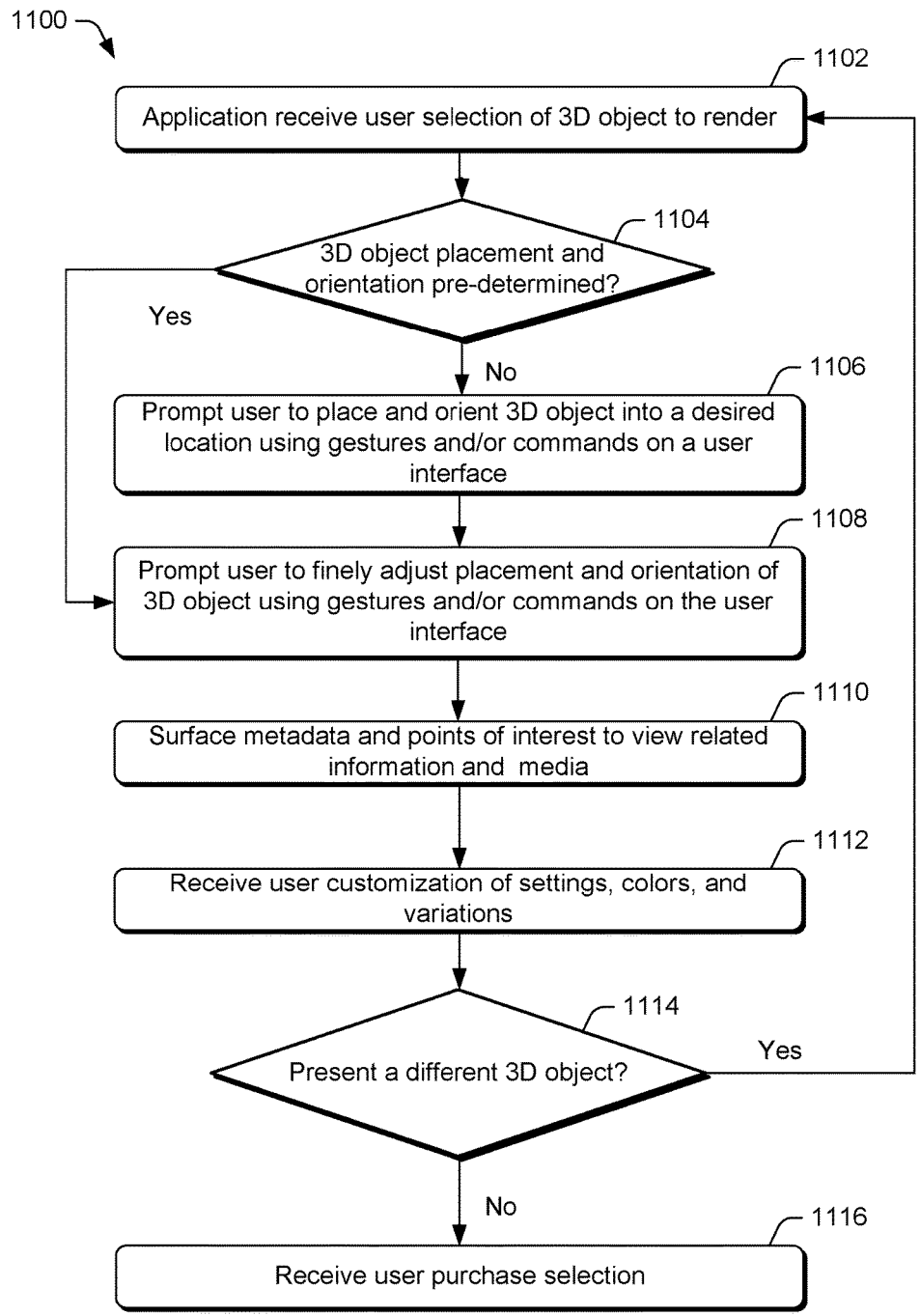
FIG. 11 is an exemplary user experience process for manipulating 3D objects within augmented reality e-commerce.

FIG. 11 is an exemplary user experience process 1100 for manipulating 3D objects within augmented reality e-commerce. At 1102, a user may select an option within an augmented reality e-commerce application which calls for rendering at least one 3D object.

At decision 1104, the augmented reality e-commerce application may determine whether the placement of the 3D object and the orientation of the 3D object have been pre-determined. For example, at 1102, the user may have chosen to view a new fireplace in the place of the current fireplace in the environment. In this example, at 1104, the placement and orientation of the fireplace image may be pre-determined. Accordingly, the application may surface the fireplace image over the location of the fireplace currently in the environment. The user may make adjustments to positioning, which may be accomplished within the user interface.

If at 1104 the 3D object placement and orientation had not been pre-determined ("No" at decision 1104), process 1100 may proceed to 1106. At 1106, the application may prompt the user to use gestures and/or commands to adjust the orientation and positioning of the 3D object. In some instances, the gestures and/or commands may be predefined for accomplishing certain adjustments. In turn, the application may receive such adjustments as made by the user. At 1108, the application may prompt the user to make fine adjustments to positioning, which may be accomplished within the user interface using gestures and/or commands. In turn, the application may receive such adjustments as made by the user. However, if in decision 1104 the 3D object placement and orientation had been pre-determined ("Yes" at decision 1104), a user may make adjustments to positioning at 1108.

In some embodiments, a user may be able to magnet a 3D object to surface in the environment. Specifically, while the user is controlling the placement of an object within an environment, the 3D object may appear to magnet to a surface such as a wall or a floor when the user has controlled the placement of the object to be within close enough distance to the surface. Virtual image data 222 and product data 224 may include metadata that may define a surface of a 3D object, such as the backside of a clock, to be in contact with a surface within an environment, such as a wall. The magnet feature may be disabled by the user.

For example, consider a user engaged in augmented reality e-commerce who may wish to visualize a 3D image of a wall-mounted battery system in their garage. Initially, the location of the battery system may not be pre-determined. When the user selects to visualize the battery system, the 3D image of the battery system may surface in front of the user and appear to hover in the middle of the garage environment. The user may engage the user interface to move the 3D image of the battery system toward a wall of the garage. The augmented reality e-commerce application may be configured to apply the magnet effect when an object is moved within two feet of a surface. When the user has moved the 3D image of the battery system to appear to be within three feet of a wall, the side of the 3D image of the battery-system defined within its metadata to be its back side may appear to magnet against the surface of the wall. A user may then finely adjust the placement of the 3D image of the wall-mounted battery system along the wall and may use a final gesture to place the 3D image.

At 1110, once a 3D object has been placed in the environment, the augmented reality e-commerce application may surface within its user interface points of interest overlaid upon and around the 3D object. At 1112, a user may engage the user interface to manipulate and augment various features of the 3D object. The various features may include settings, colors, and variations for the 3D object. For example, a user may wish to visualize a particular refrigerator model that may be ordered in white, black, or stainless steel. The user may select among three color swatches within the user interface to change the color of the 3D image of the refrigerator.

At 1114, the user may wish to view a different model before making a selection related to purchase. If the user decides to view a different model before making a selection related to purchase ("Yes" at decision 1104), process 1100 may return to 1102. However, if the user decides not to view a different model before making a selection related to purchase ("No" at decision 1104), process 1100 may proceed to 1116.

At 1116, the application may receive a purchase selection selected by the user. In some embodiments, the user may be presented with purchase options of products related to the visualized 3D object. Similarly, a user visualizing a 3D image of an outdoor patio deck may decide to purchase a related product such a can of deck stain.

Product Requirements and Environmental Constraints

Figure 12:
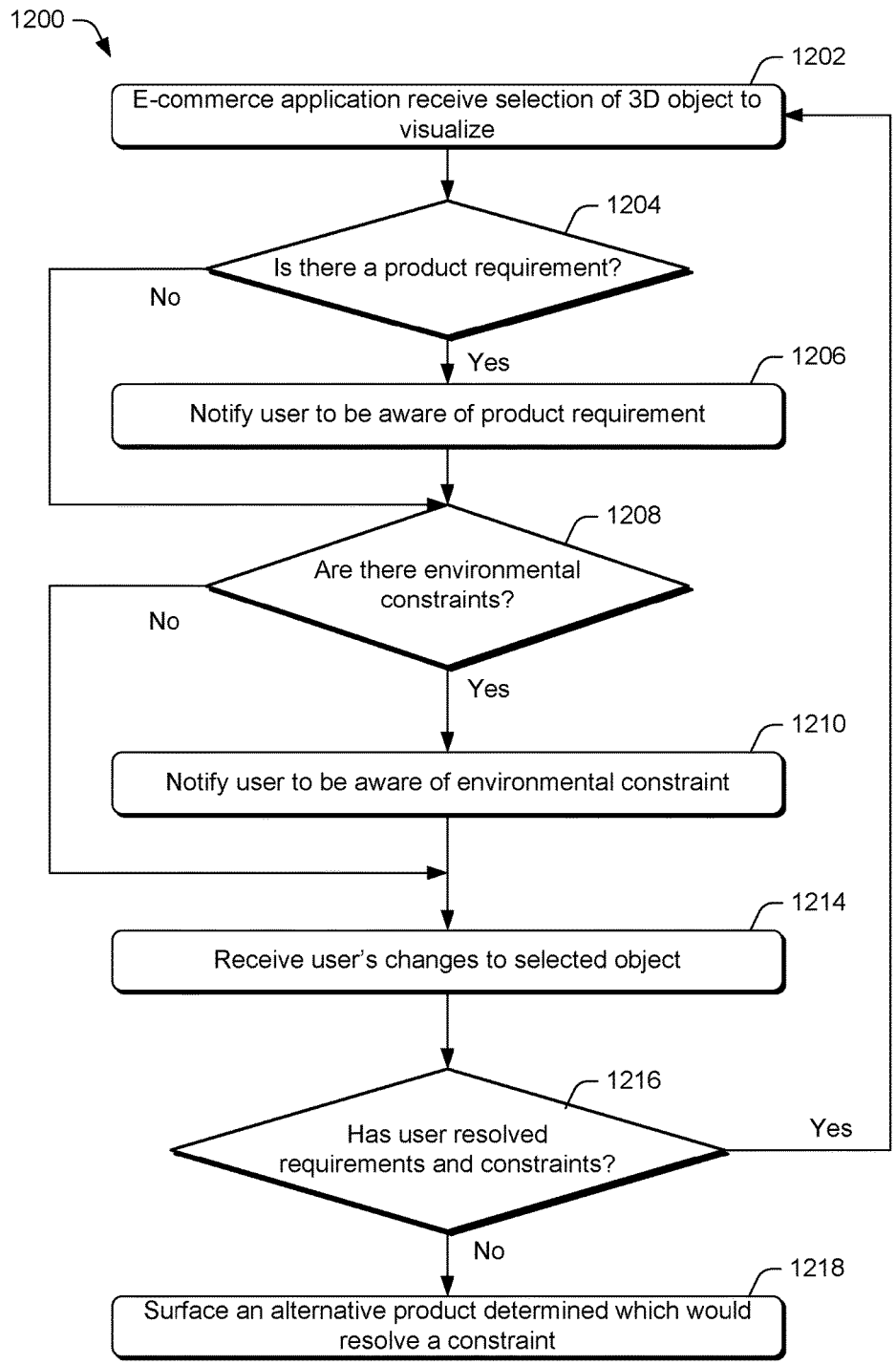
FIG. 12 is an exemplary process for identifying constraints within an augmented reality e-commerce experience.

FIG. 12 is an exemplary process for identifying constraints within an augmented reality e-commerce experience. At 1202, an augmented reality e-commerce application may receive a selection by a user of an option within an augmented reality e-commerce application that calls for rendering at least one 3D object.

At decision 1204, the application examines metadata related to the 3D object and the environment data and determines whether there are any product requirements. A 3D object's metadata may include a product requirement, which may be a feature of the product of the 3D object that requires a necessary accommodation for the product to function as intended. For example, an air conditioner unit may have a requirement within its metadata for power connection suitable to a particular level of voltage. If it is determined that the user has placed the 3D image of the air conditioner within an area not previously determined to have a suitable capacity for the requirements of the air conditioner unit ("Yes" at decision 1204), the application may surface a notification within the user interface alerting the user of the product requirement.

However, if it is determined that the user has placed the 3D image of the air conditioner within an area previously determined to have a suitable capacity for the requirements of the air conditioner unit ("No" at decision 1204), process 1200 may proceed to 1206.

At 1206, the application may surface a notification within the user interface alerting the user of at least one product requirement. At decision 1208, the application may examine metadata related to the 3D object and the environment data and determine whether there are any environmental constraints. An environmental constraint may be a spatial limitation or the absence of a feature necessary to accommodate a product requirement. An environmental constraint may be an object not fitting within a given area or the absence of a necessary power outlet for a product. Accordingly, if an environmental constraint has not been detected ("No" at decision 1208), process 1200 may proceed to 1214.

However, if an environmental constraint has been detected ("Yes" at decision 1208), process 1200 may proceed to 1210. At 1210, the application may surface a notification within the user interface alerting the user of at least one environmental constraint. Additionally, an environmental constraint may relate to the inability of an object such as a washing machine to fit through a particular doorway. Accordingly, in some embodiments, the application may highlight a portion of a 3D image that may be overlapping with a portion of the physical environment, such as a portion of a doorway or a wall. The highlight may be colored red.

For example, consider a user who has selected using an augmented reality e-commerce application to visualize a 3D image of a particular refrigerator within their kitchen environment. A user may control the placement of the 3D image of the refrigerator to appear to be in the place of an older refrigerator which is to be replaced. However, the visualized refrigerator may relate to a product having dimensions which may not be conducive to the space allowed in the physical environment. Specifically, the old refrigerator may presently be surrounded on three sides, including by a countertop and by at least one wall, while the visualized refrigerator may be substantially wider than the old refrigerator. The 3D image of the refrigerator, placed by the user into the place of the old refrigerator, may be overlapping with a portion of the physical environment, such as the countertop.

The augmented reality e-commerce application may change the overlapping portion to provide a warning. For example, the overlapping portion may appear as red or in some other color. Other forms of warning may include a strobe visual effect for the overlapping portion, blinking warning labels for the overlapping portion, sound effects that describes or is otherwise associated with the overlapping portion, and/or other visual or audio effects. Additionally, if a user may wish to see whether the selected refrigerator model would fit through a particular doorway near the kitchen, the user may control the refrigerator image to be moved around the environment and through the doorway. If any portion of the refrigerator overlaps with an edge of the doorway, the augmented reality e-commerce application may change the overlapping portion to appear as red or some other color.

At 1214, the application may receive a user's changes to the initially selected object in order to resolve product requirements and environmental constraints. At decision 1216, the application may determine whether all product requirements and environmental constraints have been resolved or otherwise dismissed by the user.

Accordingly, if all product requirements and environmental constraints have not been determined to be resolved or otherwise dismissed by the user ("No" at decision 1208), process 1200 may proceed to 1218. However, if all product requirements and environmental constraints have been determined to be resolved or otherwise dismissed by the user ("Yes" at decision 1208), process 1200 may return to 1202.

At 1218, the application may examine the environment data and user account data to suggest a similar alternative that may have fewer product requirements and environmental constraints, if any. In some embodiments, a constraint relating to moving a purchased product into a room may be noted in account data 228 and subsequently include in a manifest for the delivery service to be aware of the environmental constraint.

Thus, with the use of augmented reality with respect to home improvement, sales rates may be further increased by allowing enhanced visualization of products within the home before having to expensively ship a physical product which may not be a good fit. The sales process would benefit from enhanced methods for quickly taking measurements and identifying constraints within the home.

CONCLUSION

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. One or more non-transitory computer-readable media storing computer-executable instructions that upon execution cause one or more processors to perform acts comprising:
   receiving environmental data from one or more scanning sensors, the environmental data including at least one of spatial data or image data;
   analyzing the environmental data to detect recognizable patterns that represent environmental features, the environmental features including at least one of one or more surfaces or one or more objects;
   receiving a user selection of a surface or an object as a feature that is related to a desired product;
   comparing the feature that is related to the desired product to existing data to determine a specific product that fits the environment, the existing data including at least one of virtual image data or product data;
   generating an augmented reality environment that corresponds to the environment for presentation via an augmented reality device, the augmented reality environment presenting a plurality of three-dimensional (3D) objects that include a 3D virtual representation of the specific product; and
   presenting one or more first 3D objects of the plurality of 3D objects in the augmented reality environment that are manipulated by a sales representative in a first color, and presenting one or more second 3D object of the plurality of 3D objects in the augmented reality environment that are manipulated by a customer in a second color.

2. The one or more non-transitory computer-readable media of claim 1, wherein the generating includes:
   receiving an indication that the augmented reality device is in the environment that corresponds to the augmented reality environment;
   presenting an option for selecting the specific product for presentation in the augmented reality environment; and
   rendering the 3D virtual representation of the specific product based on at least one of the virtual image data or the product data in response to receiving a selection of the specific product for presentation in the augmented reality environment.

3. The one or more non-transitory computer-readable media of claim 2, wherein the receiving includes receiving the indication that results from a detection of the environment by the augmented reality device or receiving the indication from a user input.

4. The one or more non-transitory computer-readable media of claim 1, wherein the acts further comprise at least one of:
presenting an overlay of one or more points of interest for the 3D virtual representation of the specific product;
receiving a first purchase selection of the specific product for processing by an e-commerce application; or
receiving a second purchase selection of a product that is related to the specific product for processing by the e-commerce application.

5. The one or more non-transitory computer-readable media of claim 1, wherein the acts further comprise providing a user interface for manipulating the 3D virtual representation of the specific product in the augmented reality environment using at least one of a gesture or a command.

6. The one or more non-transitory computer-readable media of claim 5, wherein the acts further comprise:
receiving a first gesture or command via the user interface that places the 3D virtual representation of the specific product into a particular location of the augmented reality environment when the 3D virtual representation lacks a predetermined placement in the augmented reality environment; and
receiving a second gesture or command via the user interface that adjusts at least one of a placement or an orientation of the 3D virtual representation of the specific product when the 3D virtual representation has the predetermined placement in the augmented reality environment.

7. The one or more non-transitory computer-readable media of claim 5, wherein the acts further comprise at least one of:
receiving a first gesture or command via the user interface that customizes at least one of a color, a feature, or a setting with respect to the 3D virtual representation of the specific product; or
receiving a second gesture or command via the user interface that requests a presentation of an additional 3D virtual representation for a different model of the specific product.

8. The one or more non-transitory computer-readable media of claim 5, wherein the acts further comprise:
receiving a gesture or command via the user interface that places the 3D virtual representation of the specific product into a particular location of the augmented reality environment; and
generating a notification that indicates a capacity requirement for the specific product in response to a determination that the particular location lacks suitable capacity for the specific product.

9. The one or more non-transitory computer-readable media of claim 5, wherein the acts further comprise:
receiving a gesture or command via the user interface that places the 3D virtual representation of the specific product into a particular location of the augmented reality environment; and
generating a warning that indicates an environmental constraint for the specific product in response to a determination that the particular location is unable to accommodate the specific product, the environmental constraint including a spatial limitation that is unsuitable for one or more dimensions the specific product at the particular location, a spatial limitation with respect to an obstacle in the environment that hinders a movement of the specific product to the particular location, or a lack of feature that supports the specific product at the particular location.

10. The one or more non-transitory computer-readable media of claim 9, wherein the generating the warning includes showing a portion of the 3D virtual representation of the specific product that overlaps with a structure in the environment in a warning color.

11. The one or more non-transitory computer-readable media of claim 9, further comprising providing a recommendation of an alternative product that is unaffected by the environmental constraint.

12. The one or more non-transitory computer-readable media of claim 1, wherein the acts further comprise synchronizing the environmental data with computer-aided design (CAD) data for the environment that details an electrical feature or a plumbing feature, and wherein the electrical feature or the plumbing feature is used to determine the specific product that fits in the environment.

13. The one or more non-transitory computer-readable media of claim 1, wherein the environment is a room or a zone in the room.

14. The one or more non-transitory computer-readable media of claim 1, wherein the at least one of virtual image data or product data is pre-cached in a memory of the augmented reality device.

15. The one or more non-transitory computer-readable media of claim 1, wherein the generating the augmented reality environment includes at least of one:
presenting a first pre-rendered 3D image that is stored in a memory of the augmented reality device;
pre-rendering a second 3D image in full while pre-rendering wire frames of a third 3D image, the second 3D image having higher rendering priority than the third 3D image; and
reducing a pre-rendering quality of a fourth 3D image in response to a determination that the pre-rendering of the fourth 3D image is not completed within a time limit.

16. A computer-implemented method, comprising:
scanning, via one or more sensors, an environment for environmental data that includes at least one of spatial data or image data;
analyzing, via one or more computing devices, the environmental data to detect recognizable patterns that represent environmental features, the environmental features including at least one of one or more surfaces or one or more objects;
receiving, at the one or more computing devices, a user selection of a surface or an object as a feature that is related to a desired product or a desired service;
comparing, via the one or more computing devices, the feature that is related to the desired product or the desired service to existing data to determine a specific product or a specific service that fits the environment, the existing data including at least one of virtual image data or product data;
generating, via the one or more computing devices, an augmented reality environment that corresponds to the environment for presentation via an augmented reality device, the augmented reality environment presenting a plurality of three-dimensional (3D) objects that include a 3D virtual representation of the specific product or the specific service;
presenting one or more first 3D objects in the augmented reality environment that are manipulated by a sales representative in a first color, and presenting one or more second 3D object in the augmented reality environment that are manipulated by a customer in a second color; and providing, via the one or more computing devices, a user interface for manipulating at least the 3D virtual representation of the specific product in the augmented reality environment using at least one of a gesture or a command.

17. The computer-implemented method of claim 16, further comprising:
receiving a gesture or command via the user interface that places the 3D virtual representation of the specific product into a particular location of the augmented reality environment; and
presenting additional information related to placement of one or more features in the environment that supports the specific product.

18. The computer-implemented method of claim 16, further comprising:
receiving a first gesture or command via the user interface that places the 3D virtual representation of the specific product into a particular location of the augmented reality environment when the 3D virtual representation lacks a predetermined placement in the augmented reality environment; and
receiving a second gesture or command via the user interface that adjusts at least one of a placement or an orientation of the 3D virtual representation of the specific product when the 3D virtual representation has the predetermined placement in the augmented reality environment.

19. The computer-implemented method of claim 16, further comprising:
receiving a first gesture or command via the user interface that customizes at least one of a color, a feature, or a setting with respect to the 3D virtual representation of the specific product; or
receiving a second gesture or command via the user interface that requests a presentation of an additional 3D virtual representation for a different model of the specific product.

20. A system, comprising:
one or more processors; and
memory including a plurality of computer-executable components that are executable by the one or more processors to perform a plurality of actions, the plurality of actions comprising:
receiving environmental data from one or more scanning sensors, the environmental data including at least one of spatial data or image data;
analyzing the environmental data to detect recognizable patterns that represent environmental features, the environmental features including at least one of one or more surfaces or one or more objects;
receiving a user selection of a surface or an object as a feature that is related to a desired product;
comparing the feature that is related to the desired product to existing data to determine a specific product that fits the environment, the existing data including at least one of virtual image data or product data;
generating an augmented reality environment that corresponds to the environment for presentation via an augmented reality device, the augmented reality environment presenting a plurality of three-dimensional (3D) objects that include a 3D virtual representation of the specific product;
presenting one or more first 3D objects of the plurality of 3D objects in the augmented reality environment that are manipulated by a sales representative in a first color, and presenting one or more second 3D object of the plurality of 3D objects in the augmented reality environment that are manipulated by a customer in a second color; and
receiving a purchase selection of the specific product for processing by an e-commerce application or an additional purchase selection of a product that is related to the specific product for processing by the e-commerce application.

* * * * *